United States Patent
Bahr et al.

(10) Patent No.: US 10,541,697 B2
(45) Date of Patent: Jan. 21, 2020

(54) SELF-INJECTION LOCKING FOR LOW-POWER LOW-PHASE NOISE OSCILLATORS

(71) Applicant: TEXAS INSTRUMENTS INCORPORATED, Dallas, TX (US)

(72) Inventors: Bichoy Bahr, Richardson, TX (US); Baher Haroun, Allen, TX (US); Ali Kiaei, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/690,117

(22) Filed: Aug. 29, 2017

(65) Prior Publication Data

US 2019/0068197 A1 Feb. 28, 2019

(51) Int. Cl.
| | |
|---|---|
| *H03L 7/24* | (2006.01) |
| *H03K 3/03* | (2006.01) |
| *H03H 9/54* | (2006.01) |
| *H03K 3/013* | (2006.01) |

(52) U.S. Cl.
CPC ............. *H03L 7/24* (2013.01); *H03H 9/54* (2013.01); *H03K 3/0315* (2013.01)

(58) Field of Classification Search
CPC .......... H03L 7/24; H03K 3/0315; H03H 9/54
See application file for complete search history.

(56) References Cited

U.S. PATENT DOCUMENTS 7,173,749 B2 * 2/2007 Maleki .................. H03B 17/00
250/205
8,723,608 B2 * 5/2014 Bao ......................... H03L 7/24
331/117 R
2017/0163272 A1 6/2017 Xu et al.

FOREIGN PATENT DOCUMENTS

| JP | 2013123175 A | * 6/2013 |
| JP | 2016201685 A | 12/2016 |

OTHER PUBLICATIONS

Wang, To-Po, et al. "Phase-Noise Reduction of $ X $-Band Push—Push Oscillator With Second-Harmonic Self-Injection Techniques." IEEE transactions on microwave theory and techniques 55.1 (2007): 66-77. (Year: 2007).*
L. Zhang, A. Daryoush, A. Poddar and U. Rohde, "Oscillator phase noise reduction using self-injection locked and phase locked loop (SILPLL)," 2014 IEEE International Frequency Control Symposium (FCS), Taipei, 2014, pp. 1-4.
Heng-Chia Chang, "Stability analysis of self-injection-locked oscillators," IEEE Transactions on Microwave Theory and Techniques, vol. 51, No. 9, pp. 1989-1993, Sep. 2003.
(Continued)

*Primary Examiner* — Ryan Johnson
(74) *Attorney, Agent, or Firm* — Michael A. Davis, Jr.; Charles A. Brill; Frank D. Cimino

(57) ABSTRACT

For producing a low-power, low-phase noise oscillating signal using a self-injection locking oscillator, examples include: producing, using an oscillator, a signal having a base frequency component and an Nth harmonic component, in which N is a selected integer and N>1; filtering the signal through a bandpass filter with Q factor ≥5, the filter configured to pass the Nth harmonic component as a filtered Nth harmonic component; and injecting the filtered Nth harmonic component into the oscillator to self-injection lock the base frequency of the signal.

20 Claims, 14 Drawing Sheets

(56) References Cited

OTHER PUBLICATIONS

Heng-Chia Chang, "Phase noise in self-injection-locked oscillators—theory and experiment," IEEE Transactions on Microwave Theory and Techniques, vol. 51, No. 9, pp. 1994-1999, Sep. 2003.

X. Yi, C. C. Boon, M. A. Do, K. S. Yeo and W. M. Lim, "Design of Ring-Oscillator-Based Injection-Locked Frequency Dividers With Single-Phase Inputs," IEEE Microwave and Wireless Components Letters, vol. 21, No. 10, pp. 559-561, Oct. 2011.

R. Nancollas, S. Bhattarai, "A Simulation Study of Injection Locked Clocking with Ring Oscillators," https://people.eecs.berkeley.edu/~suchitb/EE241_MidTermReport, Mar. 21, 2012, accessed Jun. 5, 2017.

B. Mesgarzadeh, Atila Alvandpour, "A Study of Injection Locking in Ring Oscillators," IEEE Symposium on Circuits and Systems, May 23-26, 2005.

International Search Report for PCT/US2018/048569 dated Dec. 20, 2018.

\* cited by examiner

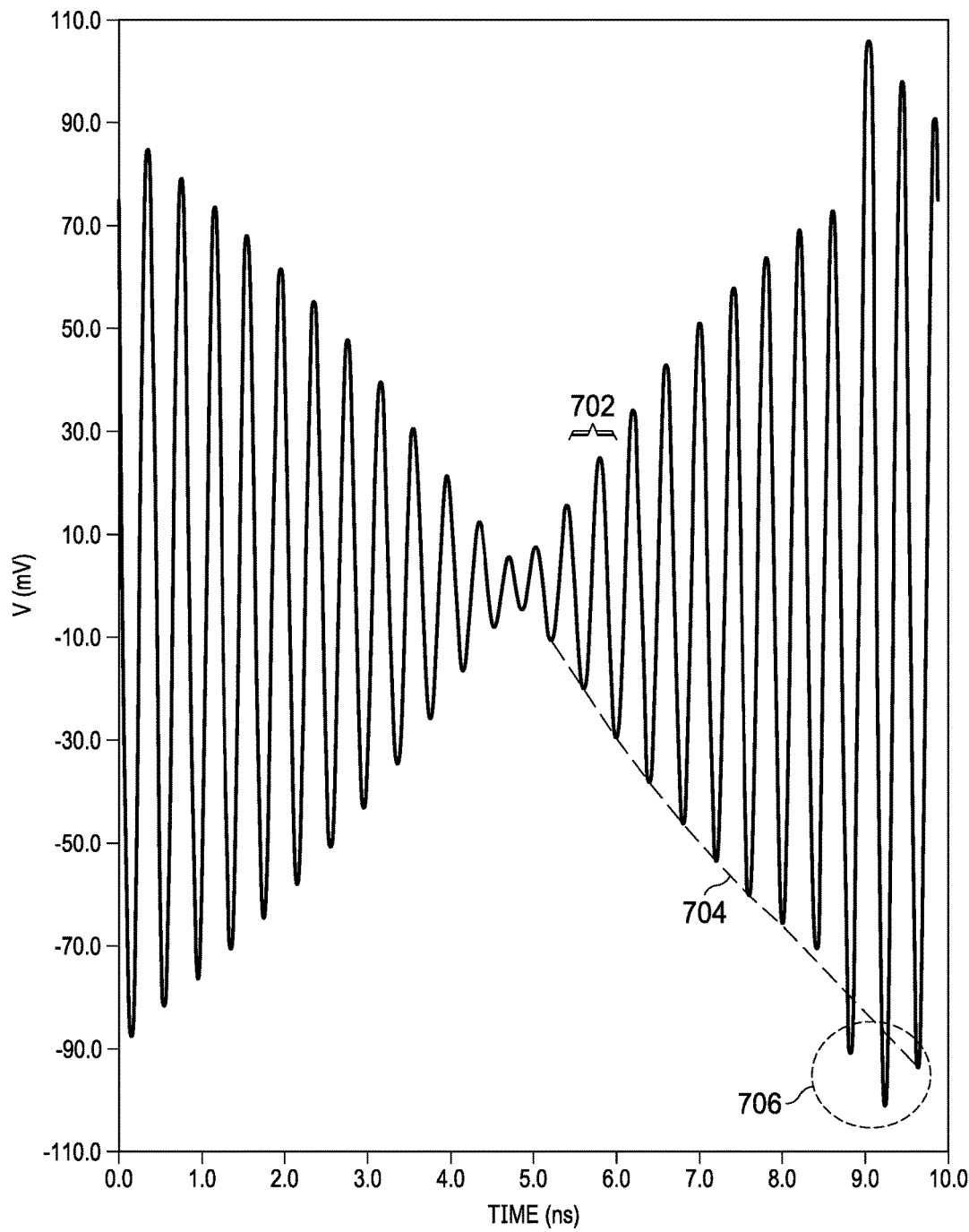

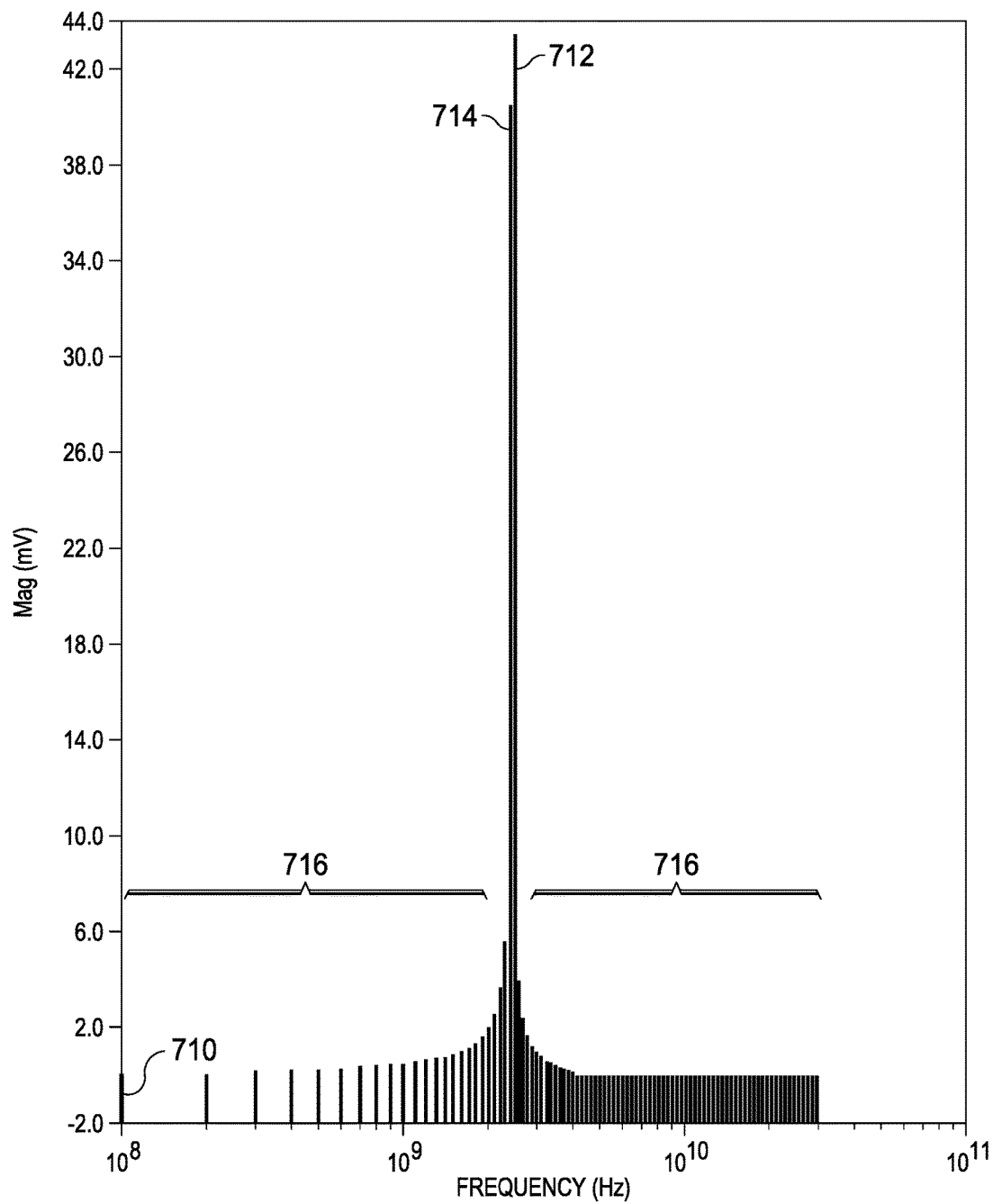

SELF-INJECTION LOCKING FOR LOW-POWER LOW-PHASE NOISE OSCILLATORS

BACKGROUND

The present application relates to oscillator circuits, and more particularly to low-power, low-phase noise clock signal generators.

Note that the points discussed below may reflect the hindsight gained from the disclosed inventive scope, and are not necessarily admitted to be prior art.

A variety of approaches exist for generating electronic device clock signals, with varying types of limitations. For example, quartz crystal oscillators may be useful for frequencies under about 200 MHz, and can provide highly stable frequency outputs with very little phase noise, but can be sensitive to temperature and vibration and may face size or frequency limitations. LC oscillators connected to a divider, as well as MEMS (micro-electromechanical systems) oscillators such as bulk acoustic wave (BAW) resonators, can also be used to produce situationally useful clocks. However, divider circuits are generally power-hungry because of transitions at the oscillator frequency, and MEMS oscillators at relatively low frequencies (e.g., 200 MHz to 1 GHz) may be too large to fit within a device area budget.

FIG. 2A shows an example of a locking range graph 200 of an oscillator. For an oscillator operating at a particular base frequency $\omega_0$ 202, the range of amplitudes and frequencies of a signal injected into which will cause the oscillator to injection lock (explained below) is called the oscillator's "locking range" 204. When a first oscillator is disturbed by a second oscillator operating at a nearby frequency, and the coupling is strong enough and the frequencies near enough, the second oscillator can "capture" the first oscillator, causing the first oscillator to oscillate at an approximately identical frequency to the second oscillator. This is injection locking. That is, for first and second oscillators with different operating frequencies, there is a minimum amplitude of the second oscillator signal that will cause the first oscillator to injection lock to the second oscillator's operating frequency. Beneath that minimum amplitude, there is a region 206 where the first oscillator will not lock. The minimum amplitude for injection locking is primarily determined by the operating frequencies of the first and second oscillators, the difference between those frequencies, and the respective structures of the oscillators. While the second oscillator's signal continues to be injected into the first oscillator at a sufficient amplitude, the first oscillator will continue to output a signal at (approximately) the operating frequency of the second oscillator. See, e.g., FIG. 5 regarding injection locking, and particularly regarding the time-dependent sensitivity of an oscillator to an injected signal.

Injection locking can also occur when the first oscillator is operating at a frequency nearby a harmonic of the second oscillator's operating frequency; or when a harmonic of the first oscillator's operating frequency is nearby the second oscillator's operating frequency; or when a harmonic of the first oscillator's operating frequency is near a harmonic of the second oscillator's operating frequency.

Output of an oscillator can be input back into the oscillator to induce self-injection locking. Self-injection locking induced on an oscillator by a sufficiently group-delayed oscillator output signal can result in significantly lowering the phase noise in the self-injection locked oscillator output signal.

FIG. 2B schematically shows an example of a self-injection locking phase locked loop 208 (SILPLL). See L. Zhang, A. Daryoush, A. Poddar and U. Rohde, "Oscillator phase noise reduction using self-injection locked and phase locked loop (SILPLL)," 2014 *IEEE International Frequency Control Symposium (FCS)*, Taipei, 2014, pp. 1-4, which is incorporated herein by reference. As shown, an SILPLL 208 comprises a voltage controlled oscillator 210 (VCO), a self-phase locked loop 212 (SPLL), a 1 km to 3 km optical fiber cable 214 used to introduce a group delay so that injection locking will reduce phase noise in the VCO 210 output, and a self-injection locking (SIL) block 216 that injects the group-delayed VCO 210 output back into the VCO 210, connected in looped series. The output of the VCO 210 comprises the output of the SILPLL 208 (through a 10 dB coupler), as well as being fed back to the SPLL 212. (MZM stands for Mach-Zehnder modulator.) Phase noise improvement in an SILPLL 208 as shown is proportional to the delay time introduced by the optical fiber 214. As a result of the length of the optical fiber 214 required to achieve phase noise improvement, there is a floor on the device area required by an SILPLL 208 as shown that achieves significant phase noise reductions in the VCO 210 output.

FIG. 2C schematically shows an example of a self-injection-locking oscillator 218. See Heng-Chia Chang, "Stability analysis of self-injection-locked oscillators," *IEEE Transactions on Microwave Theory and Techniques*, vol. 51, no. 9, pp. 1989-1993, September 2003; and Heng-Chia Chang, "Phase noise in self-injection-locked oscillators—theory and experiment," in *IEEE Transactions on Microwave Theory and Techniques*, vol. 51, no. 9, pp. 1994-1999, September 2003; both of which are incorporated herein by reference. An output signal 220 from an oscillator 222 is directed by a circulator 224 to a delay line, high Q resonator, or amplifier 226 (for example, a microwave resonant cavity measuring approximately five to six cm in length and containing a standing wave) tuned to the same frequency as the oscillator 222. (The pictured power divider and spectrum analyzer are not relevant here.) The group-delayed output 228 of the delay line, high Q resonator, or amplifier 226 is then directed by the circulator 224 back to the oscillator 222. The group-delayed output 228 is then injected into the oscillator 222 so that the oscillator 222 locks to its own, group-delayed output signal 228.

Injection locking can also be used with a ring oscillator to provide frequency division. FIG. 2D shows an example of a transistor-level diagram of a divide-by-three injection locked frequency divider 230 (ILFD). See X. Yi, C. C. Boon, M. A. Do, K. S. Yeo and W. M. Lim, "Design of Ring-Oscillator-Based Injection-Locked Frequency Dividers With Single-Phase Inputs," *IEEE Microwave and Wireless Components Letters*, vol. 21, no. 10, pp. 559-561, October 2011, which is incorporated herein by reference. The circuit shown in FIG. 2C is based on a 3-stage ring oscillator 232.

As shown in FIG. 2D, an input signal RF is connected through a capacitor and an inductor (Bias Tee) to an Injection Circuit node $V_{inj}$. $V_{inj}$ biases the gates of three transistors $M_1$, $M_2$ and $M_3$, which are connected source to drain $M_3$ to $M_2$ to $M_1$ to $M_3$. The source of $M_1$ is connected to node $V_1$, the source of $M_2$ is connected to node $V_2$, and the source of $M_3$ is connected to node $V_3$. $C_{p,1}$, $C_{p,2}$ and $C_{p,3}$ are parasitic capacitances of nodes $V_1$, $V_2$ and $V_3$, respectively. A transistor 234 has its source connected to $V_{DD}$, its drain connected to node $V_1$, and is biased by oscillator 232 input voltage $V_b$. $V_b$ is a control voltage for the ring oscillator 232; $V_b$ controls the frequency of the ring oscillator 232 by increasing or decreasing the current available to each stage through corresponding PMOS transistors 234, 238, 242. A transistor 236 has its source connected to ground, its drain connected to node $V_1$, and its bias connected to node $V_3$ and the source of $M_3$. A transistor 238 has its source connected to $V_{DD}$, its drain connected to node $V_2$, and is biased by oscillator 232 input voltage $V_b$. A transistor 240 has its source connected to ground, its drain connected to node $V_2$, and its bias connected to node $V_1$. A transistor 242 has its source connected to $V_{DD}$, its drain connected to node $V_3$, and is biased by oscillator 232 input voltage $V_b$. A transistor 244 has its source connected to ground, its drain connected to node $V_3$, and its bias connected to node $V_2$. A transistor 246 has its source connected to ground, its drain connected to oscillator output OUT, and its bias connected to node $V_3$ and the source of $M_3$.

Given the preceding, NMOS transistor 236 is a first amplifier, with its gate driven by PMOS transistor 242 drain voltage $V_3$, and having an output at node $V_1$. NMOS transistor 240 is a second amplifier, with its gate driven by PMOS transistor 234 drain voltage $V_1$, and having an output at node $V_2$. NMOS transistor 244 is a third amplifier, with its gate driven by PMOS transistor 238 drain voltage $V_2$, and having an output at node $V_3$. Node $V_3$ drives the gate of transistor 246 so as to provide the oscillator output shown as OUT, and node $V_3$ is fed back to drive the gate of NMOS transistor 236 (the first amplifier) as described. Thus, the first, second and third amplifiers are effectively connected in a "ring" structure with the sequential complementary connectors creating an oscillating signal.

Generally, in 3-stage ring oscillators, there is a one third phase delay between each stage (from $V_1$ to $V_2$, from $V_2$ to $V_3$, and from $V_3$ to $V_1$). As shown in FIG. 2D, the injection signal $V_{inj}$ is injected (at $M_1$, $M_2$ and $M_3$) such that it affects all three stages ($V_1$, $V_2$, $V_3$). ($V_{inj}$, $V_1$, $V_2$ and $V_3$ are also used to refer to respective nodes in the ILFD 230.) The ILFD 230 as designed acts as a frequency divider with a division ratio of three (3). The injection signal $V_{inj}$ therefore causes the oscillator 232 to lock to a frequency that is one third of the frequency of the injection signal $V_{inj}$.

The inventors endeavor to disclose new and advantageous approaches to producing low-power, low-phase noise periodic oscillator signals (e.g., electronic device clock signals), as further described below.

SUMMARY

The inventors have discovered new approaches to methods, devices and systems for low-power, low-phase noise oscillators.

Preferred embodiments include, for example, producing, using an oscillator, a signal having a base frequency component, an Mth harmonic component and a Pth harmonic component, wherein M and P are selected integers and M>P>1; filtering said signal through one or more bandpass filters comprising at least two resonators, said filters having Q factor ≥5, said filters configured to pass said Mth and Pth harmonic components; multiplying said filtered Mth and Pth harmonic components together to produce a multiplied signal, and filtering said multiplied signal using a low pass filter to pass a difference between said filtered Mth and Pth harmonic components, said difference comprising a filtered beat frequency waveform; and injecting said filtered beat frequency waveform into said oscillator to thereby injection lock said signal to said filtered beat frequency waveform.

Preferred embodiments also include, for example, a self-injection locking clock circuit, including: an oscillator configured to output a periodic signal with at least a base frequency and configured to injection lock to an injected signal; one or more bandpass filters with Q factor ≥5, said filters configured to pass an Mth harmonic and a Pth harmonic of said base frequency to output a filtered Mth harmonic and a filtered Pth harmonic, M and P being integers selected in at least partial dependence on said base frequency and M>P>1, said filters operatively coupled to said oscillator to filter said oscillator output; a multiplier configured to multiply said filtered Mth harmonic by said filtered Pth harmonic to produce a multiplied Mth*Pth harmonic waveform having a beat frequency component comprising a difference between said filtered Mth harmonic and said filtered Pth harmonic; and a low pass filter configured to pass said beat frequency component as a filtered beat frequency component, such that said filtered beat frequency component is injected into said oscillator.

Numerous other inventive aspects are also disclosed and claimed.

BRIEF DESCRIPTION OF THE DRAWINGS

The disclosed inventive scope will be described with reference to the accompanying drawings, which show important sample embodiments and which are incorporated in the specification hereof by reference, wherein:

FIG. 7A shows an example waveform of a multiplier output produced using two high-Q filters passing different harmonics of the base frequency.

FIG. 7B shows an example Fourier transform of the sum of the outputs of filters passing harmonics of the base frequency according to preferred embodiments.

DETAILED DESCRIPTION OF SAMPLE EMBODIMENTS

The numerous innovative teachings of the present application will be described with particular reference to presently preferred embodiments by way of example, and not of limitation. The present application broadly describes inventive scope, and none of the statements below should be taken as limiting the claims generally.

The present application discloses new approaches to producing low-power, low-phase noise clock signals, particularly using circuits and components that can be incorporated into an integrated circuit (IC) package, preferably on-chip.

Multiple related approaches, which can be combined in potentially synergistic ways, are disclosed below in two differently-titled sections. Section titles should not be read as limiting the claims or the corresponding disclosure, and disclosure in each section should be read in light of the entire disclosure herein. These sections generally relate to (1) use of self-injection locking to a harmonic of a base frequency to produce a low-power, low-phase noise oscillator, and (2) use of self-injection locking to the difference between two harmonics of a base frequency to produce a low-power, low-phase noise oscillator.

Some exemplary parameters will be given to illustrate the relations between these and other parameters. However it will be understood by a person of ordinary skill in the art that these values are merely illustrative, and will be modified by scaling of further device generations, and will be further modified to adapt to different materials or architectures if used.

I. Self-Injection Locking to a Harmonic of an Oscillator Base Frequency

Figure 1:
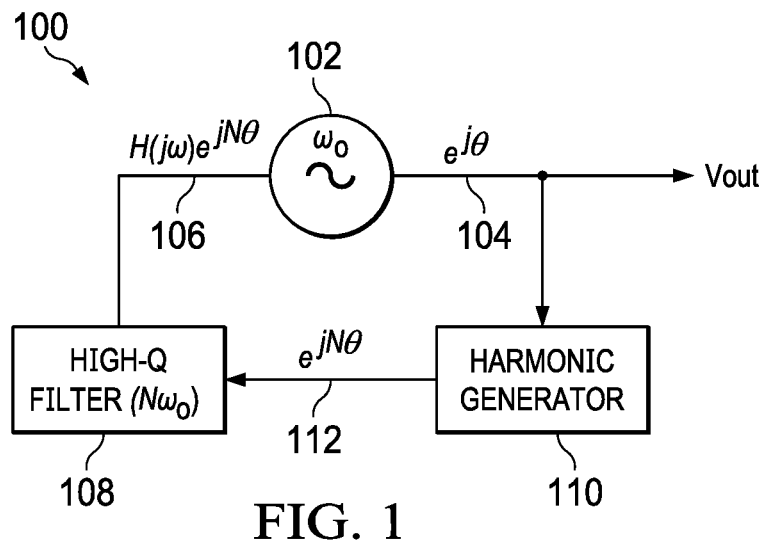
FIG. 1 schematically shows an example of a self-injection locking oscillator which injection locks to a harmonic of its base frequency to produce a low-phase noise output signal.

FIG. 1 schematically shows an example of a self-injection locking oscillator 100 according to a preferred embodiment which injection locks to a harmonic of its base frequency to produce a low-phase noise output signal. The oscillator 102 oscillates at a base frequency $\omega_0$, and produces an oscillator output signal 104. The oscillator 102 generally also produces, and the output signal 104 comprises, harmonics (multiples) of the base frequency $\omega_0$. The oscillator 102 is also configured to receive an input injection signal 106 such that, when the injection signal is of an appropriate frequency (as explained further below) and sufficient amplitude, the oscillator 102 locks to the injection signal 106.

The output signal 104, at base frequency $\omega_0$, can also be mathematically represented by $e^{j\theta}$, which is a general representation for a periodic oscillating signal.

Preferably, the oscillator 102 is selected to be relatively simple and/or inexpensive and/or small and/or otherwise convenient in design, manufacture and operation (enabled by the power and phase noise advantages of self-injection locking to a group-delayed harmonic of the oscillator output signal). A ring oscillator is an example of an oscillator that meets these critera.

If it is inconvenient to use the harmonics generated by the oscillator 102 as input to a high-Q filter 108 that in turn drives the oscillator 102 (further described below), or if the oscillator 102 does not generate harmonics (e.g., it produces a sine wave), then the output 104 of the oscillator 102 can be fed into a harmonic generator 110, e.g., a square wave generator or a narrow pulse generator. "Inconvenient" refers to the output signal 104 generated by the oscillator 102 having insufficient amplitude at a desired harmonic of the base frequency $\omega_0$ (e.g., the third harmonic, $3\omega_0$) to reliably enable injection locking. The harmonic generator 110 generates harmonics of frequencies of signals input into the harmonic generator 110. The harmonic generator 110 uses a portion of the energy in the oscillator output 104 to generate harmonics $m\omega_0$ of the oscillator's 102 base frequency $\omega_0$. Here, $m\omega_0$ refers to multiples in of the base frequency $\omega_0$. The harmonic generator's output 112 includes the Nth harmonic of the base frequency $\omega_0$. The Nth harmonic can also be mathematically represented by $e^{jN\theta}$, which is a general representation for an Nth harmonic of a periodic oscillating signal.

The harmonic generator's output 112 is fed into a high-Q filter 108. The high-Q filter 108 is a bandpass filter tuned to pass a selected Nth harmonic $N\omega_0$ of the oscillator's 102 base frequency $\omega_0$. For example, the 3rd harmonic of $\omega_0$ would be $3\omega_0$. The high-Q filter 108 passes only the selected Nth harmonic (generally, based on filter quality), reduces the phase noise and amplitude noise in the transmitted signal, and introduces a group delay. The filtered Nth harmonic signal 106 can also be mathematically represented by $H(j\omega)e^{jN\theta}$, which is a general representation for a transfer function of an Nth harmonic of a periodic oscillating signal.

The high-Q filter 108 is used to bandpass filter the oscillator output signal 104 to produce, with a group delay, a low-phase noise filtered signal 108 at the selected Nth harmonic $N\omega_0$ of the base frequency $\omega_0$. This low-phase noise or "clean", group-delayed filtered signal 108 at frequency $N\omega_0$ is injected into the oscillator 102. That is, the oscillator output signal 104 is, after filtering (and optional harmonic generation), injected back into the oscillator 102—thus, self-injection.

High Q factor "isolates" the system and makes it resistant to change. Higher Q factor means more energy is required to change the frequency output of the filter 108, and less energy is required to maintain a constant-frequency filtered signal 108. High Q factor therefore results in high filter 108 efficiency and large group delay.

While various types of high-Q filters can be used to implement the oscillator of FIG. 1, the high-Q filter 108 is preferably a MEMS (micro-electromechanical systems) filter such as a filter made using a bulk acoustic wave (BAW) resonator. It is particularly advantageous to use an oscillator as shown in FIG. 1 to produce a clock signal in the 200 MHz to 1 GHz range. This frequency range is generally too high for use of a quartz crystal oscillator to produce the clock signal directly, and sufficiently small BAW resonators for use on-chip generally resonate at frequencies significantly greater than 1 GHz (dividing down a, for example, 2.5 GHz BAW resonator output generally entails relatively high power consumption). However, as shown in, e.g., FIGS. 1 and 3, high-Q, high frequency MEMS resonators, which can be manufactured compactly and conveniently, and which can be small enough for inclusion on-chip, can be used to produce a low-power, low-phase noise clock signal.

Once the filtered signal 106 at frequency $N\omega_0$ is injected into the oscillator 102, the oscillator 102 injection locks to the low-phase noise filtered signal 106. That is, the frequency of the waveform of the output signal 104 is repeatedly corrected (phase shifted, as further discussed with respect to FIG. 5) by the injection signal 106 to produce an injection locked output signal 104 with eventual steady state frequency $\hat{\omega}_0$. In an N-stage oscillator, for example, this can comprise an injection signal 106 with frequency $N\omega_0$ simultaneously correcting N time shifted versions of the oscillator waveform, corresponding to the N stages of the oscillator. Because the injected Nth harmonic frequency $N\omega_0$ is a multiple of the base frequency $\omega_0$, injecting the $N\omega_0$ signal injection locks the oscillator 102 at (approximately, as described below) its base frequency $\omega_0$, which further results in simultaneously injection locking the harmonics $m\omega_0$.

There is a (generally small) difference between $\omega_0$ and the steady state injection locked frequency $\hat{\omega}_0$ as a result of the group delay caused by the high-Q filter 108. This can be described mathematically as, e.g., $\hat{\omega}_0 = N\omega_0 + \Delta\omega_0$, where $\hat{\omega}_0$ is the steady state frequency of the injection locked oscillator output 104, and $\Delta\omega_0$ is the group delay-induced change and is generally small. Because the base frequency $\omega_0$ and the Nth harmonic frequency $N\omega_0$ are coupled (one is a multiple of the other), injection locking using the oscillator's Nth harmonic comprises injection locking the oscillator 102 at its base frequency $\omega_0$. Further, the group delay in the self-injected signal 106 results in a low-phase noise output signal 104 at the oscillator's base frequency $\omega_0$, with a slight change in the base frequency $\omega_0$ as an additional result of the group delay. Required power to sustain stable, low-phase noise oscillation is relatively low because of the relatively low output frequency $\omega_0$ of the oscillator 102 compared to the harmonic frequency $N\omega_0$ passed by the filter 108.

Initially, the output signal 104 produced by the oscillator 102 has elevated phase noise, which is significantly reduced as the self-injection locking oscillator 100 stabilizes and the oscillator 102 enters a self-injection locked state.

Using a high-Q filter 108 also assists in enabling low-power operation of disclosed embodiments, both because a high-Q filter 108 is itself efficient, and because phase noise improvement, comparing an output 104 from a free running oscillator 102 to an output 104 of a steady state injection locked oscillator 102 in a preferred embodiment, is proportional to the amplitude of the injected signal and the Q factor of the filter 108. ("Free running" refers to the oscillator 102 prior to or isolated from injected signal perturbation.) Q factor of the filter 108 is proportional to increased group delay, and increased Q factor (hence, increased group delay) is proportional to phase noise improvement.

As further detailed later, phase noise improvement in embodiments as disclosed herein is also proportional to the perturbation projection vector (see FIG. 5) at the selected Nth harmonic, and to the number N of the selected harmonic. Some considerations in choosing N are detailed below.

A high-Q (narrow bandwidth) filter 108 is used so that a very "clean"—low-phase noise—signal can be injected into a free running, relatively high-phase noise oscillator 102. E.g., edges of the free running oscillator's 102 signal 104 are not exact. The low-phase noise filtered signal 108 gives the oscillator 102 a relatively precise frequency to injection lock to, and periodically corrects the edge timing of the oscillator's signal 104.

The high-Q filter 108 is also used because it introduces a significant group delay into the oscillator's signal 104. Self-injection locking by an oscillator 102 to its filtered, group-delayed harmonic significantly reduces the oscillator signal's 104 phase noise. As an additional result, though the oscillator signal 104 is (after some manipulation, e.g., by a harmonic generator 110 and the high-Q filter 108) injected back into the oscillator 102, the oscillator signal 104 generally does not injection lock to precisely the oscillator's 102 own base frequency $\omega_0$. Rather, because of, for example, the introduced group delay, there will generally be a slight difference in the stable, injection locked oscillator signal 104 with respect to the original base frequency $\omega_0$.

The low-phase noise Nth harmonic of the base frequency $N\omega_0$, output from the high-Q filter 108, is injected back into the oscillator 102. The oscillator 102 then injection locks to the frequency $N\omega_0$ signal, with significantly reduced phase noise in the oscillator output signal 104 (e.g., −30 dB) as a result of the injection locking.

Implementing oscillator 102 as an N-stage ring oscillator (for example), and implementing high-Q filter 108 using a BAW resonator (also called a "BAW filter"), will generally require less power (e.g., half as much power) to produce a stable low noise clock signal than if the $N\omega_0$ frequency BAW resonator were instead used with a 1/N divider to produce a clock signal. This advantage is related to the Barkhausen stability criterion: in a linear circuit with a feedback loop, the circuit will sustain steady state oscillations only at frequencies for which the loop gain is equal to unity in absolute magnitude, and the phase shift around the loop is zero or an integer multiple of $2\pi$ (360°). The circuit as shown in FIG. 1 decouples unity loop-gain from phase noise performance.

Preferably, in embodiments as shown in FIG. 1, the high-Q filter 108 will have a Q factor of at least 5 for the clock circuit to save power (e.g., in comparison to a clock using a BAW resonator as an oscillator and using a divider to produce a final, lower-frequency output signal). Also, preferably, in embodiments as shown in FIG. 1, the high-Q filter will have a Q factor of at least 10 for the oscillator circuit to show significant phase noise improvement. The present inventors contemplate that, for lower Q factor, thermal noise and inefficiencies relating to noisy filter output with minimal group delay may outweigh advantages from self-injection locking.

Figure 2A:
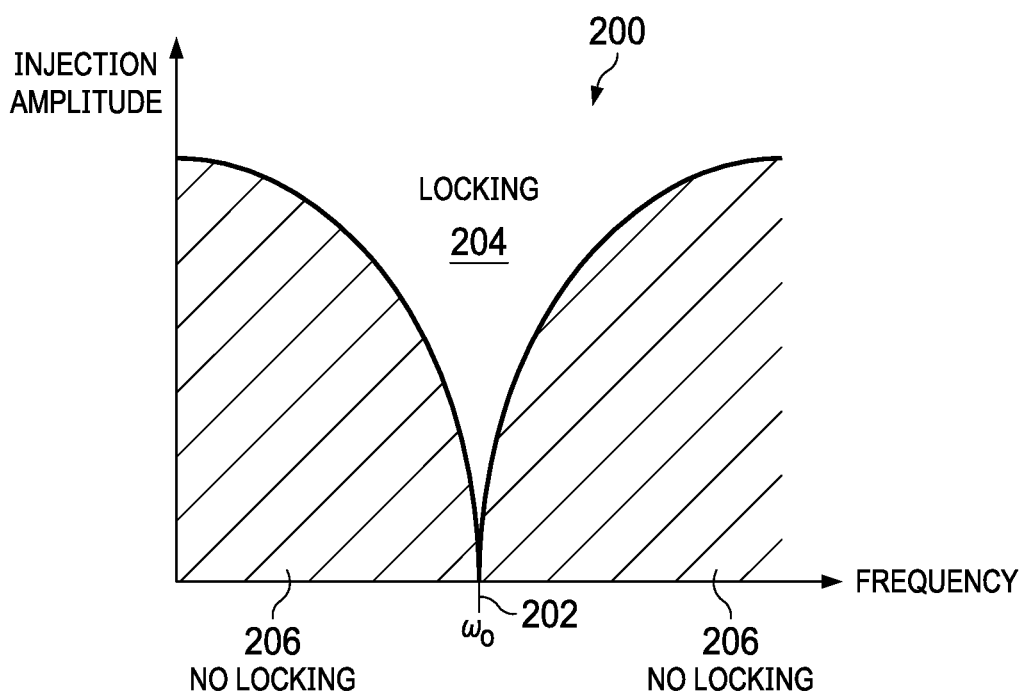
FIG. 2A shows an example of a locking range graph 200 of an oscillator.
Figure 2B:
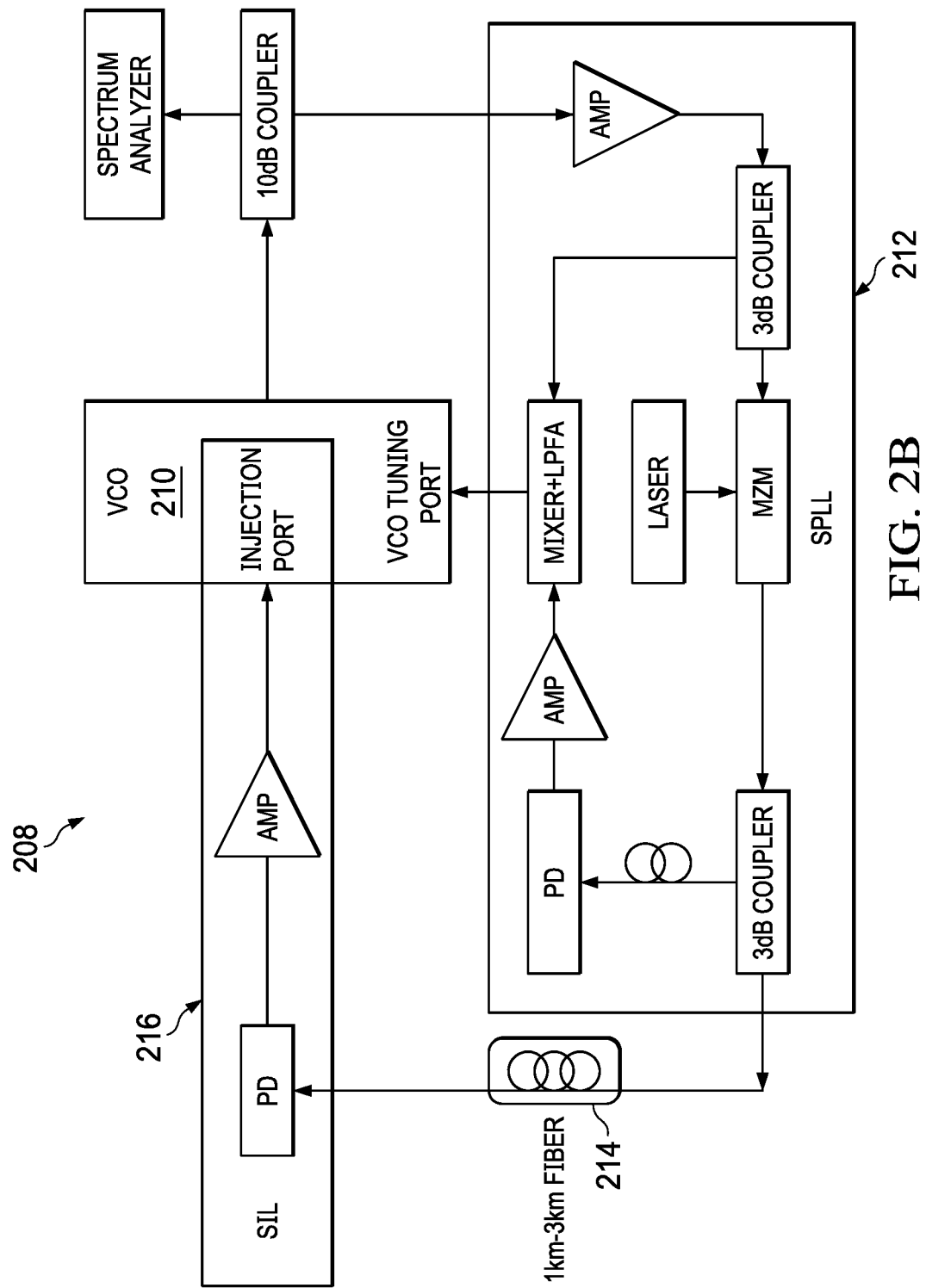
FIG. 2B schematically shows an example of a self-injection locking phase locked loop.
Figure 2C:
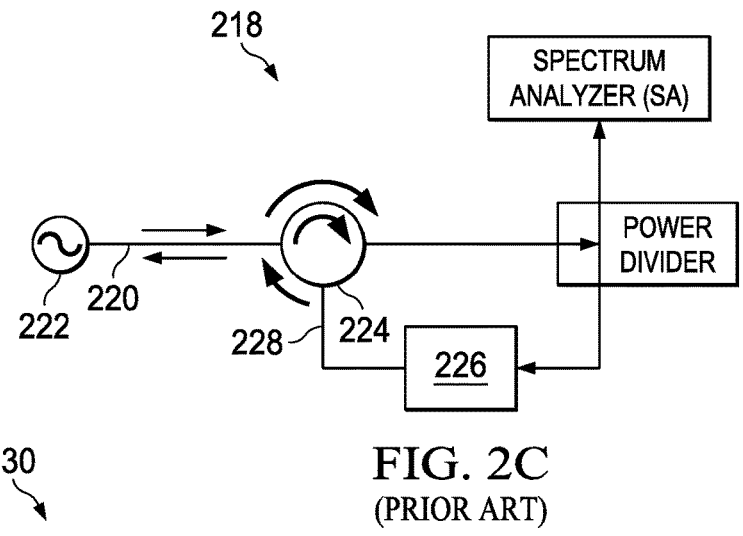
FIG. 2C schematically shows an example of a self-injection-locking oscillator.
Figure 2D:
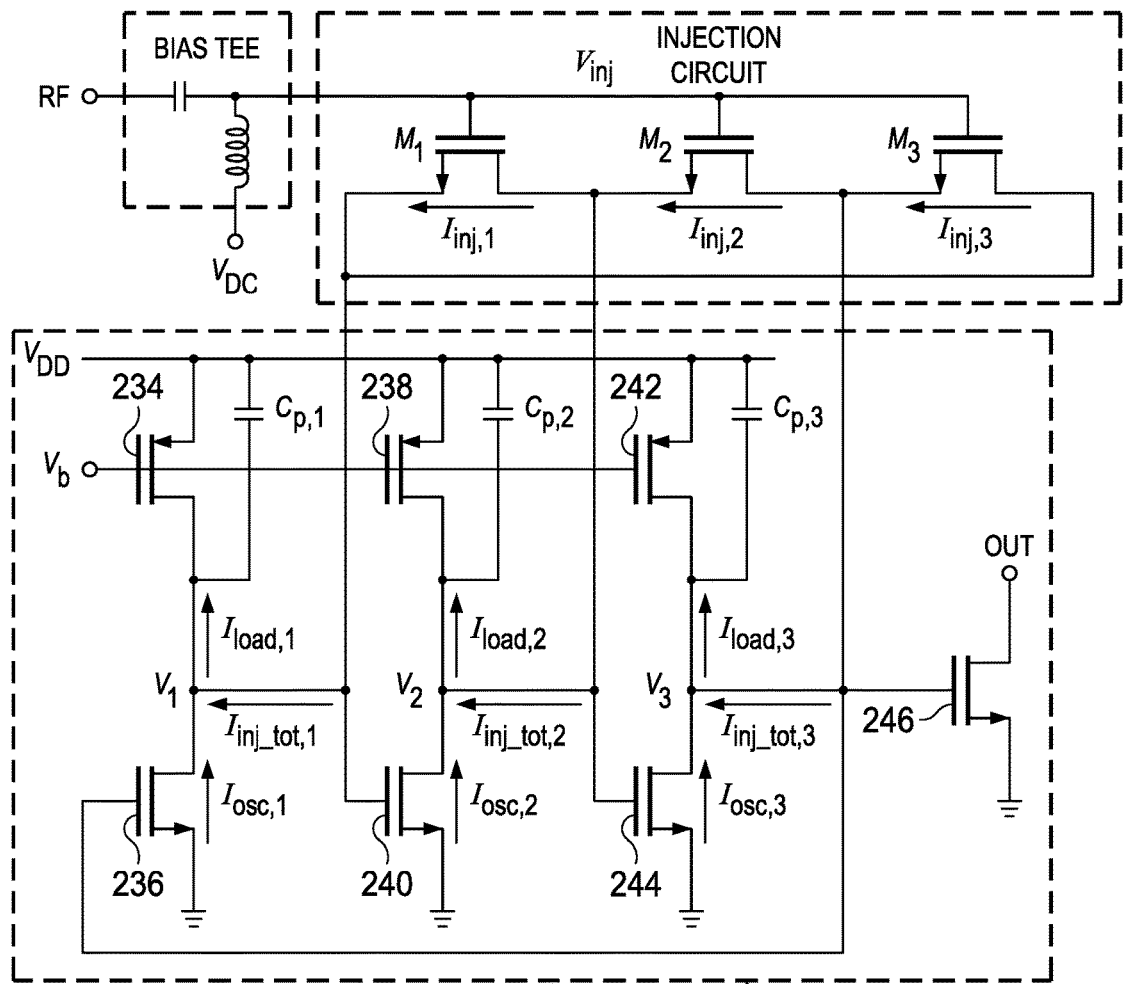
FIG. 2D shows an example of a transistor-level diagram of a divide-by-three injection locked frequency divider.
Figure 5:
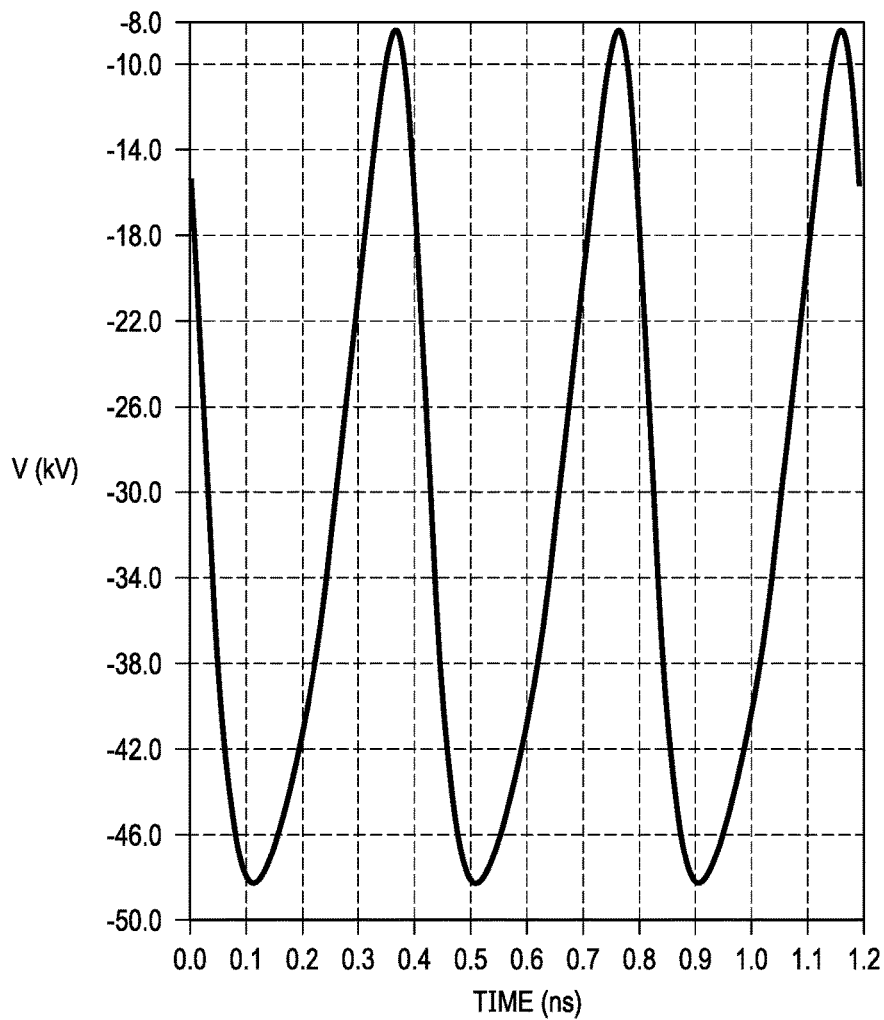
FIG. 5 shows an example of a graph of the perturbation projection vector (PPV) induced by an injected signal on an oscillator.

As shown in FIG. 5 and explained at further length below, the relatively noisy (until injection locked) harmonic of frequency (approximately) $N\omega_0$ of the oscillator's 102 base frequency $\omega_0$ should be close enough to the injected signal 106 of frequency $N\omega_0$ (as also discussed in the Background) to phase shift the oscillator signal 104 into an injection locked state. Here, "close enough" means that harmonic $N\omega_0$ of the base frequency $\omega_0$ of the free running oscillator 102 is both: within the locking range of the oscillator 102; and within the bandwidth of the high-Q filter 108—preferably, close to the central frequency of the high-Q filter 108—so that the filtered harmonic $N\omega_0$ signal's amplitude is sufficient (is not so attenuated by the high-Q filter 108) to induce injection locking in the oscillator 102 (see FIG. 2A). The oscillator signal 104, when the oscillator 102 is free running or not yet injection locked, has a particular edge timing (though edges are not exact). The injected waveform 108 repeatedly (periodically) nudges that timing to injection lock the oscillator signal 104 waveform.

As discussed below with respect to FIG. 6 (see, e.g., discussion of power detector 626) and FIG. 11, feedback and control are preferably provided to tune the base frequency $\omega_0$ of the oscillator 102 so that the Nth harmonic N$\omega_0$ of the base frequency $\omega_0$ of the free running oscillator 102 is "close enough" to the injected signal 106 of frequency N$\omega_0$ to enable injection locking (see explanation of "close enough" above). The oscillator can be tuned by, for example, changing the bias current in a ring oscillator, or by changing the capacitance at the nodes of the ring oscillator (for embodiments in which the oscillator 102 is a ring oscillator). Tuning can generally be stopped once conditions are detected (by feedback and control) to be adequate for injection locking, at which point injection locking will tend to adjust the base frequency $\omega_0$ of the oscillator 102 so that the Nth harmonic N$\omega_0$ of the base frequency $\omega_0$ closely matches the central frequency of the high-Q filter 108.

Phase noise improvement of the stable, injection locked output 104 (over the free running output 104) of embodiments as shown in FIG. 1 is proportional to the number N of the selected Nth harmonic (with a small, group delay-induced difference). That is, generally, the higher the harmonic, the lower the phase noise of the output 104. The harmonic number N can also be selected based on, for example, the desired circuit size (BAW resonators, for example, are smaller the higher the frequency at which they resonate); the desired complexity of the oscillator 102, since oscillator 102 circuit design suitable to receive signal injection is generally more complex the higher the harmonic to be injected; and the amount of tolerated device noise contribution, as device noise can be more significant at higher harmonics—higher harmonics generally have lower amplitudes, increasing the proportional significance of device noise. Odd N is preferred, because square waves contain primarily (ideal square waves contain only) components of odd-integer harmonics of the base frequency $\omega_0$. However, embodiments using even harmonics are also contemplated, e.g., injection into an LC oscillator at the 2nd or 4th harmonic of the LC oscillator's base frequency.

A self-injection locking oscillator as shown in FIG. 1, which can be used to implement, e.g., a clock circuit in an integrated circuit device, can be implemented within a device area of, for example, 200 μm×200 μm. A self-injection locking clock as shown in FIG. 1 can be fully integrated into the same chip package, or (in some embodiments) into the same substrate, as the device driven by the output clock signal.

Figure 3:
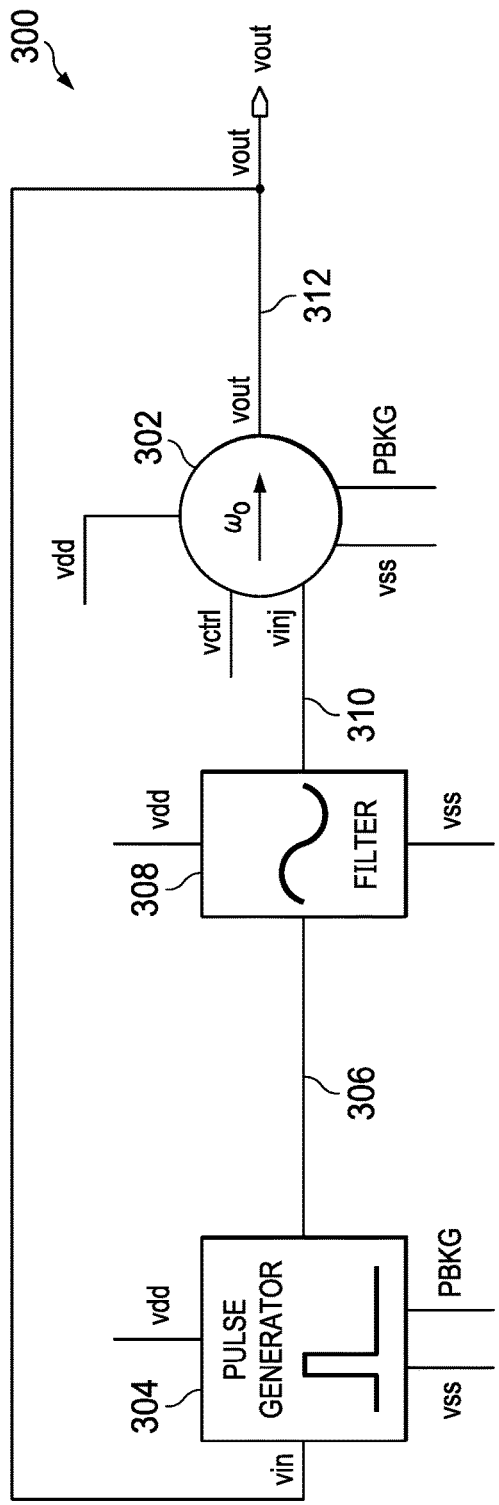
FIG. 3 schematically shows an example of a self-injection locking oscillator using an injected harmonic of an oscillator's base frequency to injection lock the oscillator.

FIG. 3 schematically shows an example of a self-injection locking oscillator 300 using an injected harmonic N$\omega_0$ of an oscillator 302 base frequency $\omega_0$ to self-injection lock the oscillator 302. A pulse generator 304 (which is essentially a harmonic generator 110 of FIG. 1), producing a signal 306 with components at the oscillator's 302 base frequency $\omega_0$ (e.g., 840 MHz) and at harmonics m$\omega_0$ (for a wide range of m≥2) of the oscillator's 302 base frequency $\omega_0$, is connected to a high-Q filter 308 (e.g., a 2.52 GHz BAW filter with Q=1000) configured to primarily pass a selected Nth harmonic 310 of the oscillator's 302 base frequency $\omega_0$ (in this example, the 3rd harmonic). The oscillator 302 can be, for example, a ring oscillator (further discussion of FIG. 3 assumes, for purposes of example, that the oscillator 302 is a ring oscillator). Though the high-Q filter 308 blocks most of the pulse generator signal 306 except at the selected filter frequency—i.e., blocks the base frequency $\omega_0$ and most of the harmonics m$\omega_0$ (with the exception of the Nth harmonic N$\omega_0$), to an extent generally determined by the Q factor of the high-Q filter 308—power loss can be held relatively low if a relatively low base frequency $\omega_0$ is used (e.g., ≤1 GHz).

The output 310 of the high-Q filter 308 is injected into the oscillator 302, e.g., a ring oscillator. Though the filter output 310 will generally be a relatively low-amplitude signal, an appropriately designed ring oscillator will generally be able to injection lock to that low-amplitude signal. One of ordinary skill in the arts of integrated circuit oscillator circuit design will understand how to configure a ring oscillator (or other types of oscillator) for this purpose, and an example circuit design is shown in FIG. 4B. The output 312 of the ring oscillator 302 is fed back into the pulse generator 304, and also comprises the output of the oscillator circuit.

The structure of the oscillator 302 generally determines which harmonic will induce injection locking in the oscillator 302, assuming the injected harmonic is within the corresponding locking range. For example, an N-stage ring oscillator (see FIG. 4A) will generally lock to its base frequency as a result of injecting the Nth harmonic of the base frequency into all N stages. Injection locking the N-stage ring oscillator to its base frequency will simultaneously injection lock the ring oscillator's harmonics (if any) as well. For example, if N is 3, then a 3-stage ring oscillator will injection lock on injection of its 3rd harmonic into all three stages (with a slight difference between the free running base frequency $\omega_0$ and the steady state injection locked base frequency $\omega_0$ induced by the group delay caused by the high-Q filter 308).

Figure 4A:
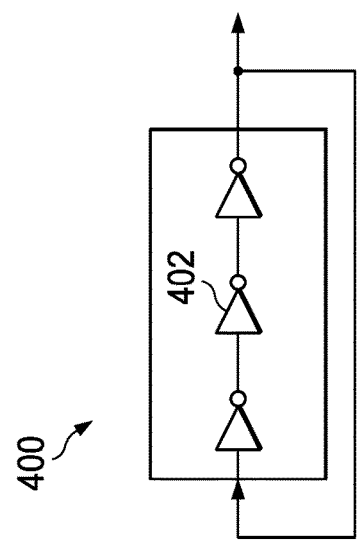
FIG. 4A schematically shows an example of a 3-stage ring oscillator.
Figure 4B:
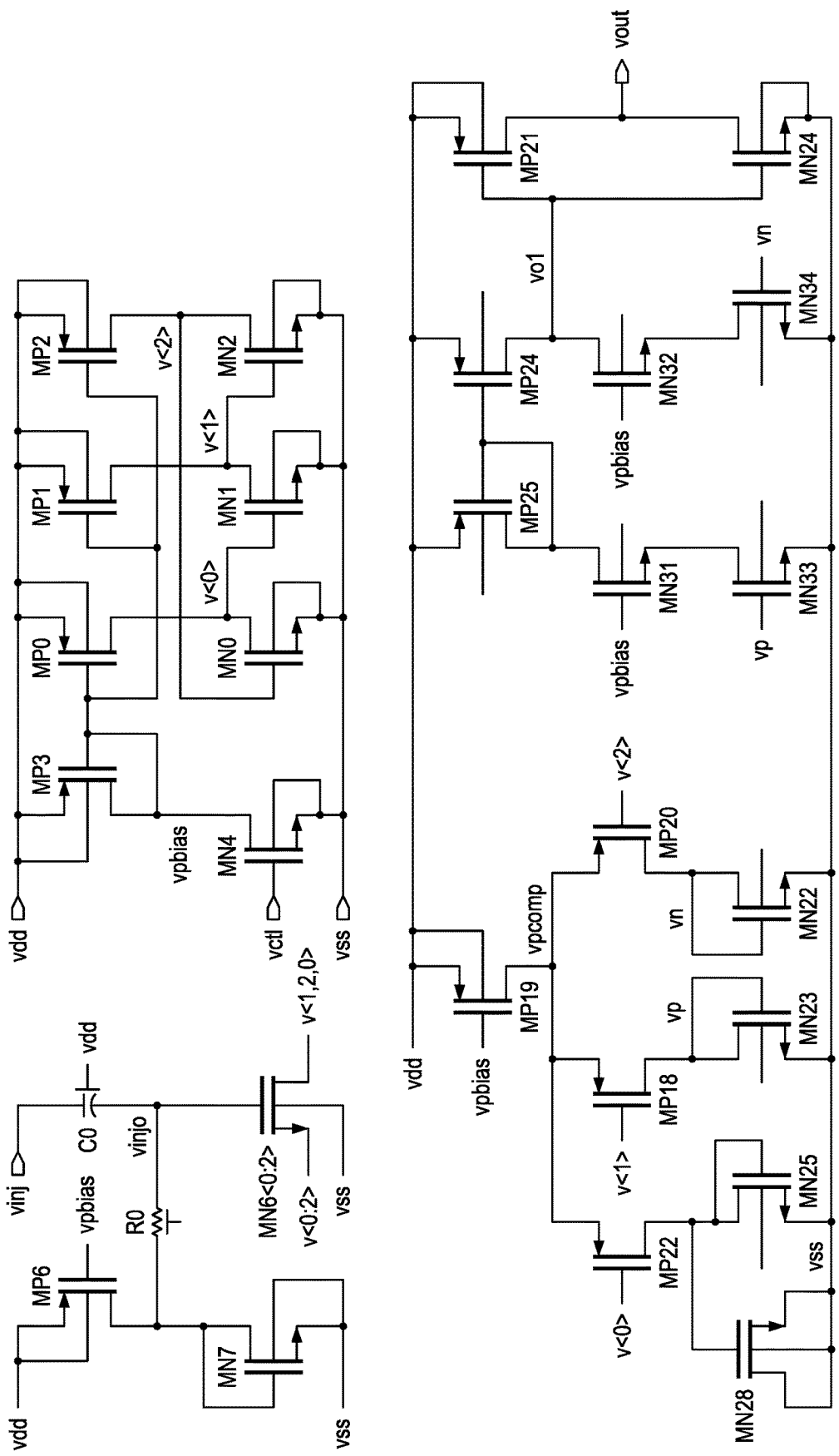
FIG. 4B shows an example of a transistor-level diagram of a 3-stage ring oscillator.

FIG. 4A schematically shows an example of a 3-stage ring oscillator 400. A 3-stage ring oscillator 400 can comprise, as shown, three inverters 402 connected in series, with the output of the third inverter 402 fed back into the input of the first.

FIG. 4B shows an example of a transistor-level diagram of a 3-stage ring oscillator configured to receive an injected signal into each of its three stages. As shown, the design of FIG. 4B implements an embodiment of a ring oscillator usable as oscillator 102 (see FIG. 1) or oscillator 302 (see FIG. 3), as would be readily designed by someone of ordinary skill in the art of integrated circuit oscillator circuit design.

FIG. 5 shows an example of a graph of the perturbation projection vector (PPV) induced by an injected signal on an oscillator. The PPV shows how the oscillator signal changes if a specific signal is injected at a specific time during its period (PPV is periodic with the same period as the oscillator). That is, the PPV shows how much the oscillator signal's phase changes—i.e., advances or delays—based on the timing and amplitude of the injected signal. In the system represented by FIG. 5, the oscillator has a three times longer period than the injected signal (approximately 1.2 ns, versus approximately 0.4 ns).

If a delta function (a pulse) is injected where the derivative of the oscillator signal's voltage with respect to time (the slope of the oscillator waveform) is not zero, the phase of the oscillator's signal will be phase shifted. Conversely, if a delta function is injected where the derivative of the oscillator signal's voltage with respect to time is zero, the phase of the oscillator's signal will not be phase shifted by the injected delta function.

The median voltage (v) value of the PPV as shown in FIG. 5 represents the zero value of the system, the voltage value around which the system oscillates. At the median voltage value of the PPV as shown in FIG. 5, the phase of the oscillator signal is not shifted by the injected signal. As shown in FIG. 5, PPVs are time dependent, that is, injection at different time points in an oscillator signal's period causes different shifts in phase of the oscillator's signal. Also, PPVs are periodic; for an injection signal with frequency $N\omega_0$, a PPV will generally have frequency $N\omega_0$, and will cause the oscillator to injection lock to the Nth harmonic.

If a signal injected into the oscillator results in the integral of the perturbation projection vector multiplied by the injection signal (voltage/time) equaling zero, the oscillator is not affected by the injection signal. This also corresponds to the oscillator being injection locked to the injection signal, with the oscillator and the injection signal being in phase with each other. If the integral of the PPV multiplied by the injection signal equals a constant value, then the oscillator is injection locked to the injection signal with a specific and fixed phase difference. If the integral of the PPV multiplied by the injection signal equals a linear function of time t (e.g., $\Delta\omega_0 t$), then the oscillator will lock to the injection signal with a frequency difference $\Delta\omega_0$. Generally, other results— other values of the integral of the PPV multiplied by the injection signal—will correspond to the injection signal perturbing the oscillator. In this latter case, depending on, e.g., the structure of the oscillator and where in the oscillator the signal is injected, the injection signal will typically perturb the oscillator in a way that will nudge it closer to injection locking with a zero or other constant value for the PPV multiplied by the injection signal.

Injection locking is achieved when the frequency and phase of the oscillator are such that the integral of the product of the PPV and the injection signal equals zero, a constant or a linear function of time t. If the oscillator phase deviates from its injection locked state, such that the integral of the PPV multiplied by the injection signal no longer equals one of these types of values, the injection signal will again perturb the oscillator phase to cause it to return to an injection locked state. Injection locking can be thought of as being caused by negative feedback inherent in the structure of the oscillator receiving an injected signal. For this reason, injection locking to a "clean" signal reduces the phase noise of the oscillator.

As disclosed herein, the inventors have discovered methods and systems for producing a low-power, low-phase noise periodic oscillating signal using a self-injection locking oscillator. For example, an N-stage oscillator can be configured to receive an injected signal into each of the oscillator's N stages and connected in looped series with, optionally, a harmonic generator, and a high-Q filter. The high-Q filter, preferably comprising a compact MEMS resonator, passes an Nth harmonic of the base frequency of the oscillator with a group delay. The group-delayed Nth harmonic of the oscillator's base frequency is self-injected into the oscillator—that is, the oscillator's modified output is injected back into the oscillator. The oscillator output is injection locked by the injected Nth harmonic to the oscillator's base frequency. The oscillator's base frequency consequently injection locks to itself, with a slight change resulting from the group delay. This significantly reduces phase noise in the injection locked oscillator output signal (e.g., $-30$ dB).

II. Self-Infection Locking to a Difference Between Two Harmonics of an Oscillator Base Frequency FIG. 6 schematically shows an example of a self-injection locking oscillator 600 according to a preferred embodiment, which injection locks to a difference between two harmonics of an oscillator 602 base frequency $\omega_0$. The oscillator 602 oscillates at a base frequency $\omega_0$, and produces an oscillator output signal 604. The oscillator 602 generally also produces, and the output signal 604 comprises, harmonics (multiples) $m\omega_0$ of the base frequency $\omega_0$. The oscillator 602 is also configured to receive an input injection signal 606 such that, when the injection signal is of an appropriate frequency (as explained further below) and sufficient amplitude, the oscillator 602 locks to the injection signal 606. Once the oscillator 602 reaches steady state injection locked oscillation, the base frequency of the oscillator 602 is referred to as $\hat{\omega}_0$.

The oscillator output 604 is optionally fed into a pulse generator 608, which can be configured as a harmonic generator, and/or as an energy source for driving the self-injection locking oscillator 600. In an energy source role, the pulse generator 608 can assist in maintaining unity loop gain in the oscillator circuit, further to the Barkhausen stability criterion. The pulse generator 608 produces a signal 610 with components at the oscillator's 602 base frequency $\omega_0$ and at harmonics $m\omega_0$ (for a wide range of m $\geq 2$) of the oscillator's 602 base frequency $\omega_0$. The purpose and function of a harmonic generator in a self-injection locking oscillator is further discussed with respect to FIG. 1 (harmonic generator 110) and FIG. 3 (pulse generator 304).

The output 610 of the pulse generator 608 is filtered by two closely matched high-Q filters 612, 614, which are bandpass filters each tuned to pass a respective, different selected M and P harmonic, with frequencies $M\omega_0$ and $P\omega_0$, of the oscillator's 102 base frequency $\omega_0$.

Figure 10:
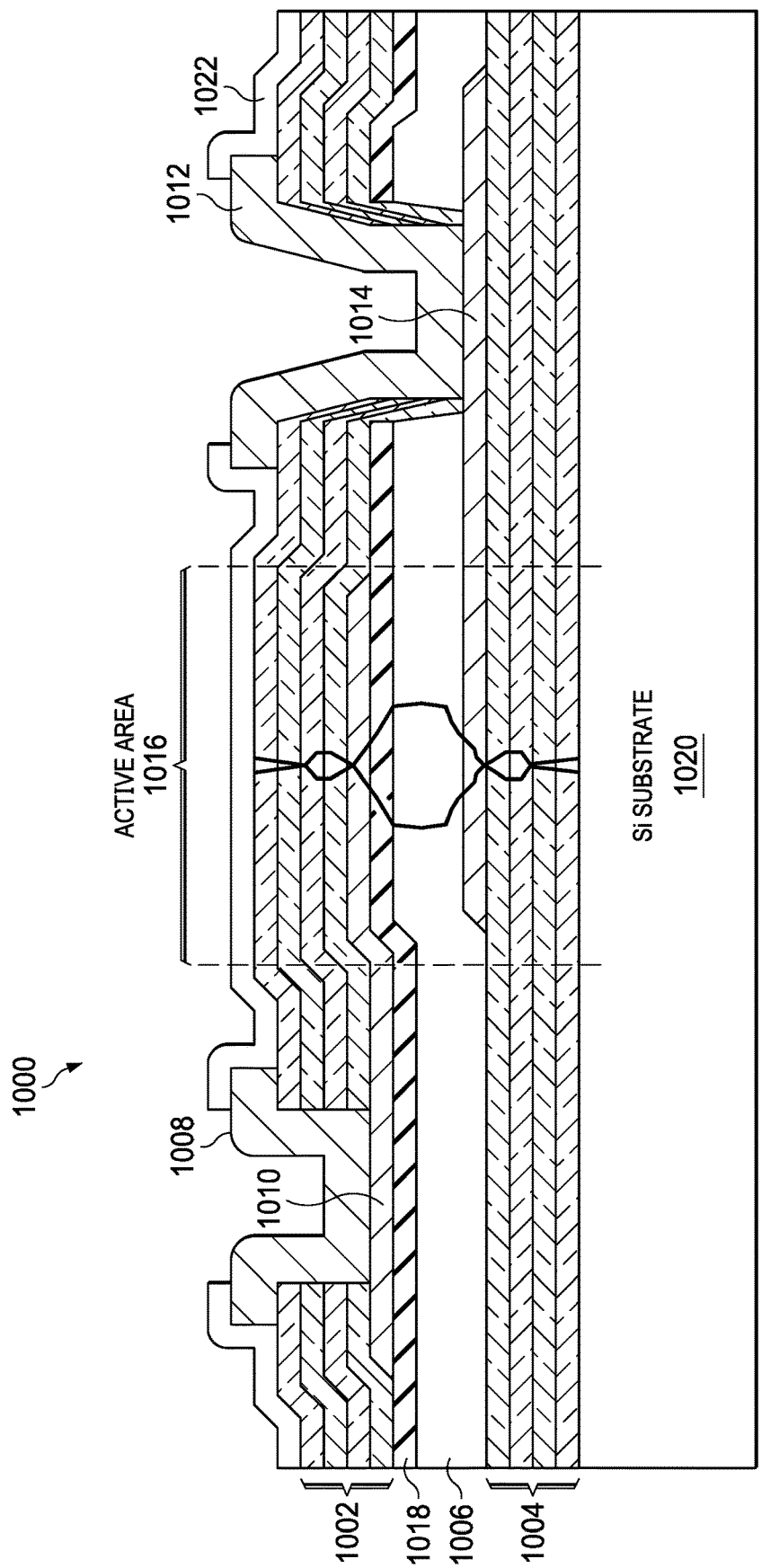
FIG. 10 shows a cross-sectional view of an example of the structure of a BAW resonator.

As further discussed with respect to FIG. 10, "closely matched" means that the two filters 612, 614 are designed so that their responses to absolute drifts in their passed frequencies are substantially identical—preferably, identical within design and manufacturing limits. Absolute drifts are fixed-value changes in passed frequencies of a filter, i.e., changes that are not proportional to the passed frequency of the filter. Absolute drifts can be caused by, for example: aging of the device, such as due to repeated thermal and/or vibration-induced stress; device packaging stress; and random variations in device manufacturing process, such as overlay or critical dimension errors that are insufficient to cause device failure. These phenomena can also cause relative shift, i.e., proportional changes in passed frequencies of a filter.

It is advantageous, in design and manufacture of closely matched high-Q filters 612, 614, for the filters 612, 614 to be located in proximity to each other on the same device, e.g., integrated circuit. Fabricating the filters 612, 614 in proximity to each other on the same chip will generally result in the filters 612, 614 receiving substantially the same stresses—individually and cumulatively, during fabrication and during operation—at substantially the same times. If the filters 612, 614 are closely matched, then the filters 612, 614 receiving the same stresses will result in them experiencing the same absolute drifts. Because the oscillator 602 injection locks to the difference between the harmonics $M\omega_0$ and $P\omega_0$, or to a harmonic (a multiple) of that difference (as further explained below), absolute drifts applied to both filters effectively cancel out. That is, for absolute drifts $\Delta M\omega_0$ and $\Delta P\omega_0$, where $\Delta M\omega_0 = \Delta P\omega_0$, the cancelling out is as shown in the following Eq. 1:

$$(M\omega_0+\Delta M\omega_0)-(P\omega_0+\Delta P\omega_0)=(M\omega_0+\Delta M\omega_0)-(P\omega_0+\Delta M\omega_0)=M\omega_0-P\omega_0 \quad \text{Eq. 1:}$$

Figure 6:
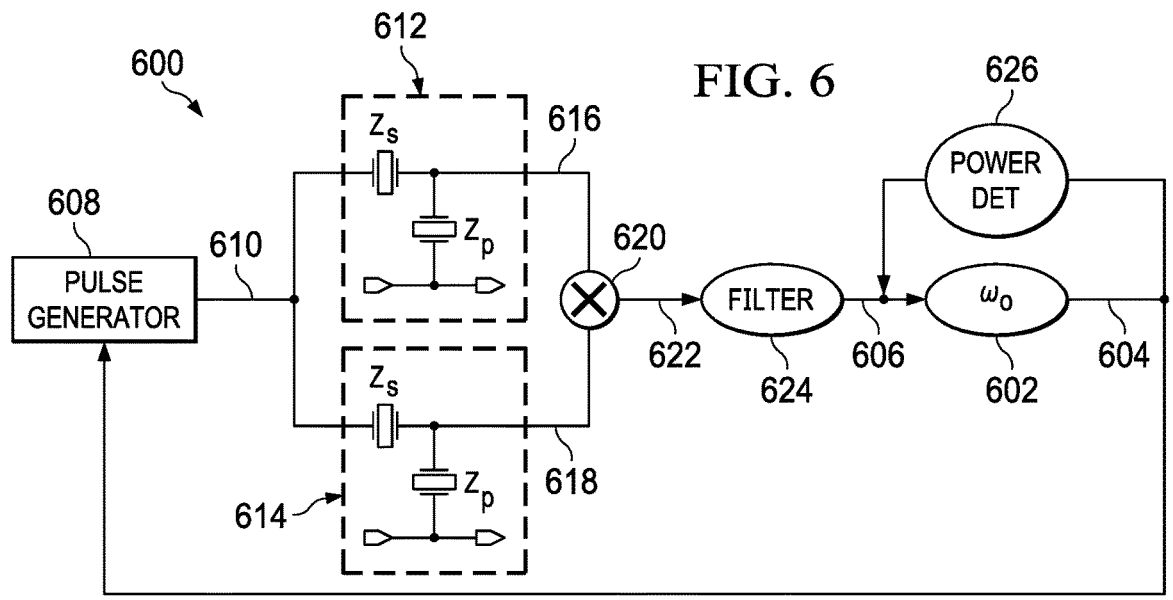
FIG. 6 schematically shows an example of a self-injection locking oscillator according to a preferred embodiment, which injection locks to a difference between two harmonics of an oscillator base frequency.

While various types of high-Q filter can be used to implement the oscillator of FIG. 6, the high-Q filters 612, 614 are preferably MEMS filters, such as filters made using BAW resonators. BAW resonators are particularly advantageous because, for example, they can be fabricated in very close proximity to each other (e.g., on the same chip). Fabrication on the same chip enables BAW resonators to closely match, generally significantly more so than filters fabricated on different chips or in different fabrication lots.

It is particularly advantageous to use an oscillator circuit as shown in FIG. 6 to produce a clock signal in the 100 MHz to 1 GHz range. Advantages in using filters comprising MEMS resonators are discussed herein with respect to, e.g., FIG. 1 and high-Q filter 108, as well as FIG. 10. As shown in, e.g., FIGS. 6 and 8, high-Q, high frequency MEMS resonators, which can be manufactured compactly and conveniently, and which can be small enough for inclusion on-chip, can be used to produce a low-power, low-phase noise clock signal.

The high-Q filters 612, 614 operate as discussed with respect to FIG. 1 and high-Q filter 108, producing "clean", group-delayed signals. High-Q filter 612 produces an output 616 with a frequency comprising the Mth harmonic $M\omega_0$ of base frequency $\omega_0$, and high-Q filter 614 produces an output 618 with a frequency comprising the Pth harmonic $P\omega_0$ of base frequency $\omega_0$. The two high-Q filter output signals 616, 618 can also be represented mathematically as a function of time t as $\cos(M\omega_0 t)$ and $\cos(P\omega_0 t)$.

The high-Q filter outputs 616, 618 are multiplied together by a multiplier 620, to produce multiplier output 622. (This operation is routinely performed in communications systems by mixers; see below with respect to FIG. 9 for an example and further explanation.) The multiplier output 622 can be expressed mathematically as:

$$\cos(M\omega_0 t)\cos(P\omega_0 t) = \tfrac{1}{2}[\cos(M\omega_0 - P\omega_0)t + \cos(M\omega_0 + P\omega_0)t] \quad \text{Eq. 2}$$

In Eq. 2, the $\cos(M\omega_0 - P\omega_0)t$ term of the multiplier output 622 is the beat frequency of the two filter outputs 616, 618, i.e., the difference between the two frequencies. As mentioned above and further explained with respect to FIG. 10, injecting the beat frequency (the difference) into the oscillator 602 to cause the oscillator 602 to injection lock means that the high-Q filters 612, 614 can be designed to reduce or eliminate undesired frequency variations in the injection signal 606 caused by absolute drift and thermal drift.

FIG. 7A shows an example waveform 700 of a multiplier output 622 produced using two high-Q filters 612, 614 passing different harmonics $M\omega_0$ and $P\omega_0$ of the base frequency $\omega_0$. As shown in FIG. 7A, a relatively high frequency oscillation 702 is contained within a lower frequency amplitude envelope 704 (with aberrations 706 due, e.g., to harmonics passed by the filters 612, 614 other than the selected M and P harmonics as a result of the filters 612, 614 having finite Q factors). The higher frequency oscillation 702 corresponds to the $\cos(M\omega_0 + P\omega_0)t$ term of the multiplier output, and the lower frequency amplitude envelope 704 corresponds to the $\cos(M\omega_0 - P\omega_0)t$ term of the multiplier output 622. The $\cos(M\omega_0 - P\omega_0)t$ term will also describe the injection signal 606 that will be injected (self-injected) into the oscillator 602, and corresponds to either the base frequency $\omega_0$, or to an Nth harmonic $N\omega_0$ of the base frequency $\omega_0$, as explained below.

FIG. 7B shows an example Fourier transform 708 of the sum of the outputs of filters passing harmonics of the base frequency according to preferred embodiments. In the example shown in FIG. 7B, the base frequency $\omega_0 = 100$ MHz component 710 of the filter outputs 716, 718 is relatively small; first filter 612 primarily passes first frequency 712 $M\omega_0 = 2.5$ GHz (the 25th harmonic), and second filter 614 primarily passes second frequency 714 $P\omega_0 = 2.4$ GHz (the 24th harmonic). The aberrations 706 from the amplitude envelope 704 discussed with respect to FIG. 7A are due to unwanted harmonics 716 passed by the filters 612, 614. While such high-numbered harmonics will generally have relatively low amplitude, the difference between them (the beat frequency waveform) will generally have an envelope with a higher amplitude than the output of either of the BAW resonators alone.

Returning to FIG. 6, a low pass filter 624 is used to filter out the $\cos(M\omega_0 + P\omega_0)t$ term, with its relatively high frequency, from the multiplier output 622. The remaining signal 606, which can be represented as $\cos(M\omega_0 - P\omega_0)t$—the beat frequency of the two high-Q filter outputs 616, 618—is injected into the oscillator 602.

The oscillator 602 is preferably tuned so that $\omega_0$ or $N\omega_0$ equals the beat frequency of the high-Q filters 612, 614. This tuning is performed using feedback provided by a power detector 626 to cause the oscillator 602 to output a base frequency $\omega_0$ that results in an injection locked output signal 604 of sufficient amplitude (e.g., maximal amplitude). The oscillator 602 is tuned by, for example, selecting or voltage-controlling capacitors controlling the oscillator 602 base frequency; preferably, the base frequency $\omega_0$ can be both increased and decreased (e.g., depending on control inputs provided to capacitors). This feedback and tuning are used to address circuit variability based on process variation, temperature, idiosyncrasies of the power supply, and other factors which can affect the waveform frequency and envelope amplitude by, for example, 30% (or more). Tuning the oscillator 602 is further described with respect to FIG. 11.

If the beat frequency of the two high-Q filter outputs 616, 618 is near the base frequency $\omega_0$ of the free running oscillator 602 (i.e., closer to the base frequency $\omega_0$ than to harmonics $m\omega_0$ of the base frequency $\omega_0$) then the oscillator 602 will injection lock to its base frequency $\omega_0$. (As previously explained, self-injection locking to a group-delayed signal will actually cause the oscillator 602 to injection lock to some slightly different frequency $\hat{\omega}_0 = \omega_0 + \Delta\omega_0$.) This case can be approximated as $M\omega_0 - P\omega_0 = \omega_0$. That is, M–P=1, meaning that the Mth and Pth harmonics filtered by the high-Q filters 612, 614 are adjacent harmonics of the base frequency $\omega_0$.

Alternatively, if the beat frequency of the two high-Q filter outputs 616, 618 is near an Nth harmonic $N\omega_0$ of the base frequency $\omega_0$, then (as discussed with respect to, e.g., FIGS. 1 and 3) the oscillator 602 will lock as a result of injection of an Nth harmonic $N\omega_0$. This case can be approximated as $M\omega_0 - P\omega_0 = N\omega_0$. That is, M–P=N, meaning that the difference between the Mth and Pth harmonics filtered by the high-Q filters 612, 614 is the Nth harmonic $N\omega_0$ of the base frequency $\omega_0$. This demonstrates the synergy between titled Sections I and II of this disclosure: the ability to injection lock the oscillator 602 as a result of injection of its base frequency $\omega_0$ or of a harmonic of its base frequency $N\omega_0$, and the ability to select the harmonics M and P to which the high-Q filters 612, 614 are tuned, provide a wide range of customizability in the component, power, and frequency requirements and performance of a self-injection locking oscillator 600 as shown in FIG. 6.

Figure 8:
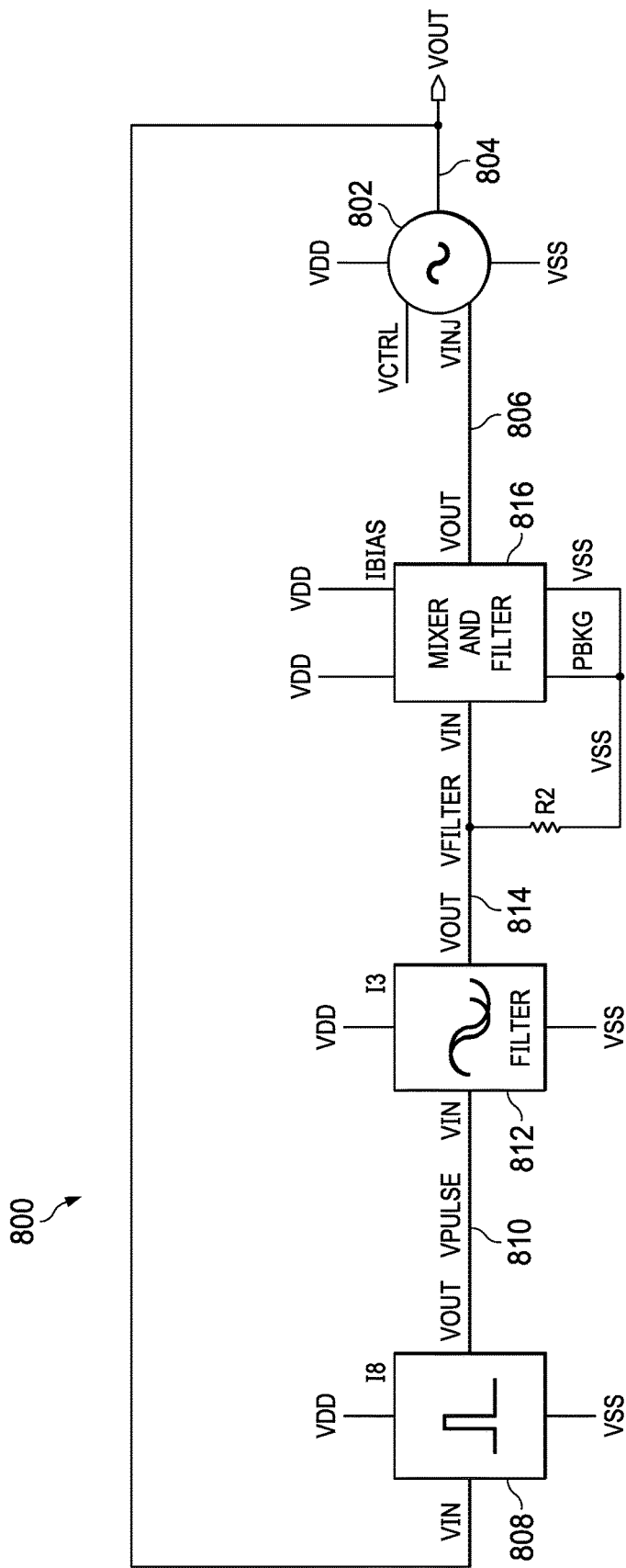
FIG. 8 schematically shows an example of a self-injection locking oscillator according to a preferred embodiment, which injection locks to a difference between two harmonics of an oscillator base frequency.

FIG. 8 schematically shows an example of a self-injection locking oscillator 800 according to a preferred embodiment, which injection locks to a difference between two harmonics of an oscillator 802 base frequency $\omega_0$. The oscillator 802 can be, for example, an on-chip ring oscillator (e.g., with $\omega_0 = 100$ MHz), with an output 804 and an input 806 by which a signal can be injected into the oscillator 802 to cause the oscillator 802 to injection lock. An optional pulse generator 808 generates harmonics $m\omega_0$ of the oscillator output 804 using a portion of the energy in the oscillator output 804 (that is, the pulse generator 808 outputs the base frequency $\omega_0$ and harmonics $m\omega_0$ of the base frequency).

The pulse generator output 810 is filtered through a high-Q filter 812 comprising two closely matched high-Q resonators tuned to M and P harmonics and placed to produce a filter output 814 that will enable a waveform at the beat frequency of the two high-Q resonators ($M\omega_0-P\omega_0$) to be created; preferably, the high-Q resonators are located to facilitate generation of the sum of their outputs. This can, for example, comprise placing the high-Q resonators in series and forcing a current through them, which will generally result in a voltage that is the sum of the responses of the two high-Q resonators.

The high-Q resonators are preferably MEMS resonators, and more preferably BAW resonators for reasons described with respect to, e.g., FIG. 1. The filter output 814, which is the pulse current multiplied by the filter impedance, can be mathematically described for a filter comprising resonators in sequence as: $\cos(M\omega_0 t)+\cos(P\omega_0 t)$.

The filter output 814 is then fed into a mixer and filter 816, which squares the filter output 814 and applies a low pass filter to produce a waveform corresponding to the lower frequency component described above with respect to FIG. 6, $\cos(M\omega_0-P\omega_0)t$, i.e., the beat frequency of the outputs of the two resonators used to make the filter 812. The design and behavior of the mixer and filter 816 is further explained below with respect to FIG. 9. ("Mixer" is used here to describe a non-linear element, such as a MOS transistor, that has quadratic non-linearity.)

The group-delayed beat frequency waveform is then self-injected back into oscillator 802 to cause the oscillator 802 to either injection lock the base frequency to the beat frequency, producing a steady state oscillator output 804 base frequency $\hat{\omega}_0=\omega_0+\Delta\omega_0$; or to injection lock a harmonic of the base frequency to the beat frequency, producing a steady state oscillator output 804 with an Nth harmonic such that $N\hat{\omega}_0=N\omega_0+\Delta\omega_0$; wherein $\hat{\omega}_0$ is the steady state injection locked oscillator 802 base frequency, and $\omega_0$ is the free running oscillator 802 base frequency.

Figure 9:
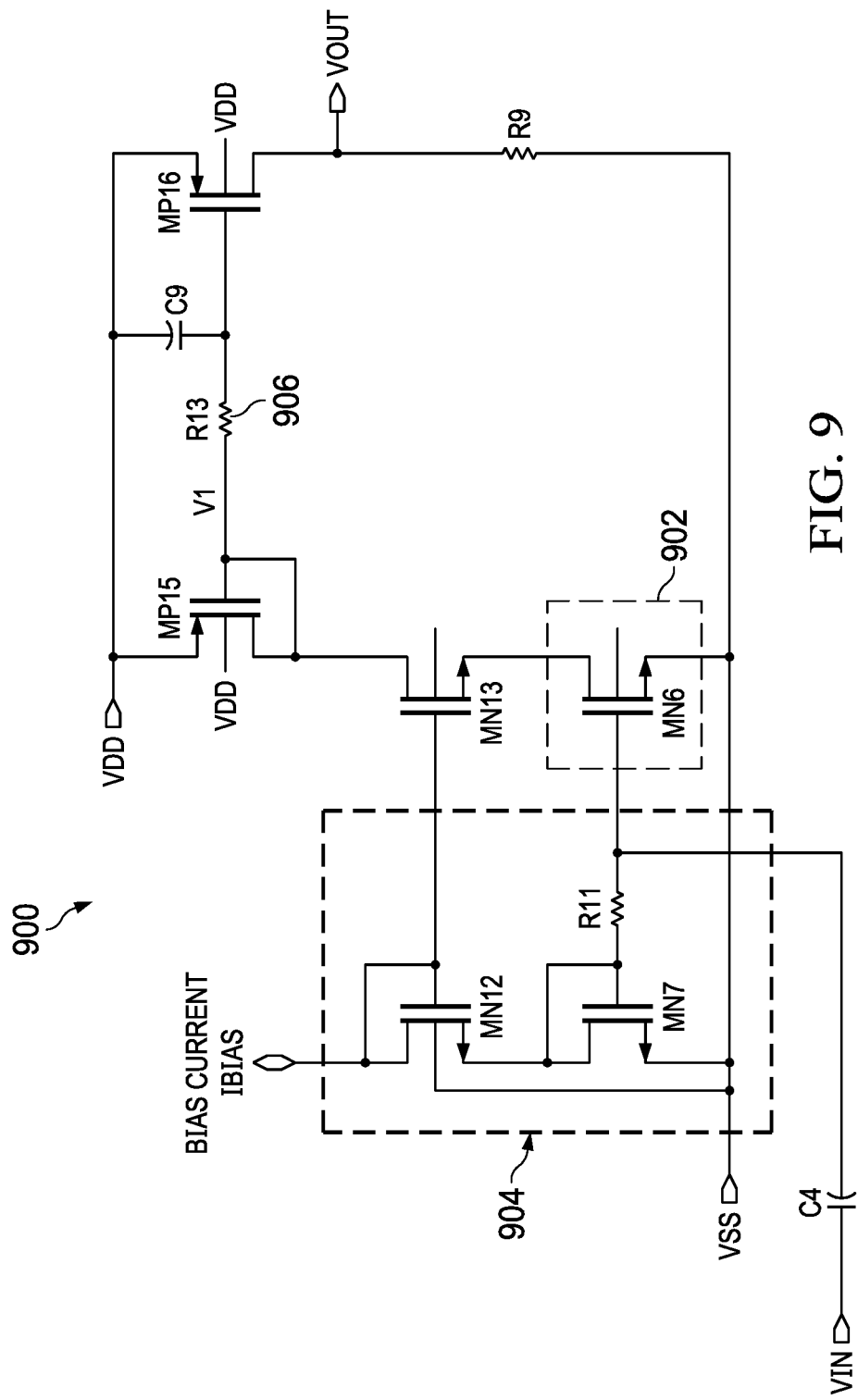
FIG. 9 schematically shows an example of a mixer and filter for selecting the beat frequency from a signal comprising the sum of two different harmonics of the base frequency.

FIG. 9 schematically shows an example of a mixer and filter 900 for selecting the beat frequency from a signal comprising the sum of two different harmonics of the base frequency. As shown in FIG. 9, a MOSFET transistor can be used as a mixer 902, and a biasing circuit 904 provides the bias voltage for the mixer 902. The mixer 902 squares the input signal (e.g., pursuant to the transfer function of a MOSFET operating in saturation), i.e., the filter output 814, which is $V_{in}=\cos(M\omega_0 t)+\cos(P\omega_0 t)$. The waveform of the square of this input signal $V_{in}$ can be mathematically represented as:

$$(\cos(M\omega_0 t)+\cos(P\omega_0 t))^2=\cos^2(M\omega_0 t)+\cos^2(P\omega_0 t)+2\cos(M\omega_0 t)\cos(P\omega_0 t) \quad \text{Eq. 3:}$$

In light of Eq. 2, and given the identity $\cos^2\theta=\frac{1}{2}(1+\cos 2\theta)$, the right hand side of Eq. 3 can be rewritten as:

$$\tfrac{1}{2}(2+\cos(2M\omega_0 t)+\cos(2P\omega_0 t))+\cos(M\omega_0-P\omega_0)t+\cos(M\omega_0+P\omega_0)t \quad \text{Eq. 4:}$$

The terms in Eq. 4 other than the beat frequency waveform, i.e., $\cos(M\omega_0-P\omega_0)t$, are of significantly higher frequency than the beat frequency, and are preferably filtered out using a low pass filter 906 such as an R-C filter. The resulting filtered beat frequency waveform–$\cos(M\omega_0-P\omega_0)$ t–comprising a "clean" (low-phase noise), group-delayed signal at the beat frequency $M\omega_0-P\omega_0$ of the two closely matched high-Q resonators, is preferably used as the injection signal 806 for the oscillator 802 (or the oscillator 602).

FIG. 10 shows a cross-sectional view of an example of the structure of a BAW resonator 1000. It is particularly advantageous to use BAW resonators to make high-Q filters 612, 614 or high-Q filter 812, because BAW resonators configured to resonate at different harmonics of an oscillator base frequency can be closely matched to respond similarly (or the same) to temperature drift and to absolute drift.

In embodiments as shown in FIG. 10, a BAW resonator 1000 comprises top Bragg mirrors 1002 and bottom Bragg mirrors 1004 (acoustic mirrors), which are made of alternating layers of acoustically transparent materials with different properties of acoustic impedance, for example, TiW and $SiO_2$. Between the Bragg mirrors 1002, 1004 is a piezoelectric layer 1006 (e.g., AlN). A first contact 1008 is electrically connected to a top electrode 1010 and a second contact 1012 is electrically connected to a bottom electrode 1014; electrodes can be made of, e.g., molybdenum. Excitation of the top and bottom electrodes 1010, 1014 induces a voltage across the piezoelectric layer 1006 which causes the piezoelectric layer 1006 to oscillate, primarily within an active area 1016 in which mechanical energy is confined and isolated. The frequency of oscillation of the piezoelectric layer 1006 is inversely proportional to the piezoelectric layer's 1006 thickness. The frequency of oscillation of the piezoelectric layer 1006 is affected by temperature; as further discussed below, the piezoelectric layer's 1006 oscillating frequency's temperature response is related to a ratio between the piezoelectric layer's 1006 thickness and the thickness of a temperature compensating oxide 1018 (which passively compensates for temperature-induced shifts in the frequency of the piezoelectric layer 1006) which is disposed between the piezoelectric layer 1006 and the top Bragg mirrors 1002. A BAW resonator can be fabricated on a Si substrate 1020. A BAW resonator also preferably comprises a protective overcoat 1022, e.g., SiN.

In a BAW resonator, frequency change $\Delta\omega$ with temperature T can be described as $\Delta\omega(T)=(1+\alpha T)\omega$, where $\alpha$ is the temperature coefficient of frequency factor (TCF), which depends on, for example, Young's modulus (stiffness), density change with temperature, and the amount of vibrational energy stored in the material under consideration within the BAW resonator structure. For BAW resonators tuned to resonate at harmonics $M\omega_0$ and $P\omega_0$ of the base frequency $\omega_0$, temperature response of the BAW resonators is described by $\Delta\omega_M(T)=(1+\alpha_M T)M\omega_0$ and $\Delta\omega P(T)=(1+\alpha_P T)P\omega_0$. This means that, where $M\omega_0-P\omega_0=\omega_0$, the beat frequency temperature response is:

$$\Delta\omega_M(T)-\Delta\omega_P(T)=(1+\alpha_M T)M\omega_0-(1+\alpha_P T)P\omega_0=\omega_0+\alpha_M TM\omega_0-\alpha_P TP\omega_0 \quad \text{Eq. 5:}$$

If $\alpha_M=\alpha_P$, then beat frequency temperature response equals $(1+\alpha T)\omega_0$.

However, by adjusting the thickness of the temperature compensating oxide, the $\alpha$ scalar values can be calibrated to eliminate the temperature coefficient of the beat frequency (in practice, nearly eliminate, as shown by the empirical example provided below). This will occur if the temperature-dependent terms in Eq. 5 are set equal: $\alpha_M TM\omega_0=\alpha_P TP\omega_0$. This is true if $$\frac{\alpha M}{\alpha P}=\frac{P}{M}.$$

If the BAW resonators are designed such that this condition is true, then the beat frequency temperature response is:

$$\Delta\omega_M(T) - \Delta\omega_P(T) = \omega_0 + \frac{P}{M}\alpha_P TM\omega_0 - \alpha_P TP\omega_0 = \omega_0 \quad \text{Eq. 6}$$

That is, the temperature-dependent terms cancel out, and beat frequency temperature response becomes a constant that is not temperature-dependent: $\omega_0$, the beat frequency, which equals the base frequency. Note that if $M\omega_0 - P\omega_0 = N\omega_0$, then the temperature-dependent terms cancel out to leave the beat frequency, which equals the Nth harmonic of the base frequency.

Controlling TCF to cancel out temperature dependency of the BAW resonators in the high-Q filters 612, 614 or high-Q filter 812 can result in a significant improvement in temperature-independence of the self-injection oscillator 600 or 800. For example, from TCF=3,400 ppm/° C. to 148 ppm/° C., a 23-fold improvement.

As discussed with respect to FIG. 6, BAW resonators are "closely matched" if their responses to absolute drifts in their passed frequencies are substantially identical. Where the base frequency of an oscillator 602 or 802 depends on the beat frequency of a closely matched pair of high-Q BAW resonators, this means that absolute drifts of the resonators cancel out, resulting in the oscillator 602 or 802 having a highly stable injection locked base frequency that is substantially invariant with respect to sources of absolute drift. Closely matched BAW resonators can be fabricated by, for example, placing them in proximity with each other, so that they receive similar stresses, and by changing their designs with respect to each other as little as possible to achieve the different frequencies (harmonics M and P) required by the oscillator 600 or 800 to produce the beat frequency used to injection lock the oscillator 600 or 800. For example, the thickness of the top electrode layer 1010 or of the piezoelectric layer 1006 can be modified to tune a BAW resonator 1000 (generally, the piezoelectric layer 1006 will need to be modified to tune a BAW resonator 1000 between harmonics of an oscillator's 600 or 800 base frequency), or mass loading can be performed by adding an extra layer of metal or of oxide (which will generally result in damping oscillation). Preferably, BAW resonators are fabricated side-by-side on the same chip, with all layers being identical except a single layer (other than the temperature compensating oxide 1018, which is adjusted as disclosed above to cancel out temperature effects on the beat frequency); the smaller the mismatch, the better, for the purpose of compensating for absolute drift effects.

Figure 11:
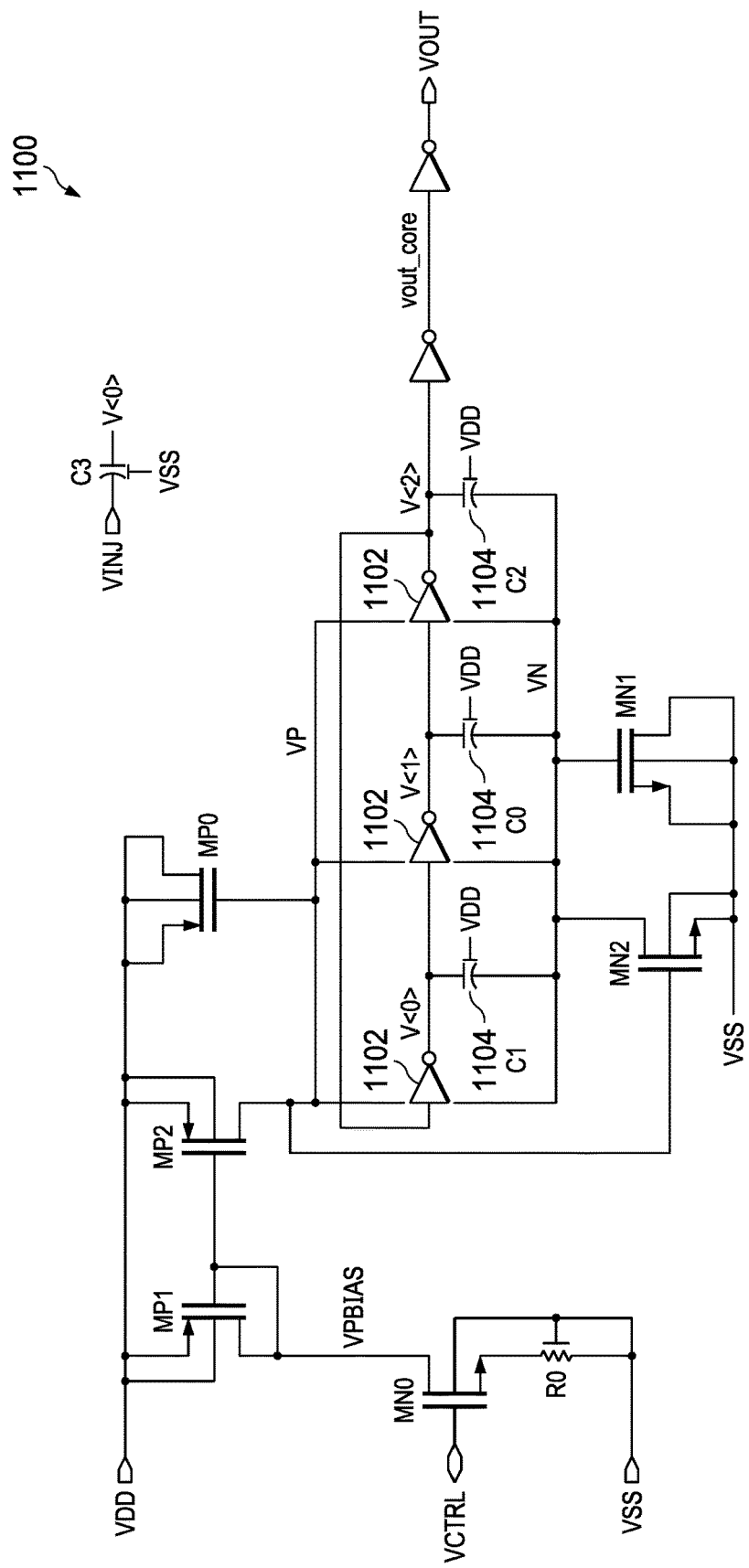
FIG. 11 schematically shows an example of a transistor-level diagram of a current controlled oscillator that can be used to implement a self-injection locking oscillator.

FIG. 11 schematically shows an example of a transistor-level diagram of a current controlled oscillator 1100 that can be used to implement a self-injection locking oscillator. As shown in FIG. 11, an oscillator (e.g., oscillator 602 or 802) can be, for example, a 3-stage current starved ring oscillator comprising three inverters 1102 and three voltage-controlled capacitors 1104. In a current starved ring oscillator, lower current results in lower oscillator frequency, and higher current results in higher oscillator frequency. The function of the capacitors 1104 can be adjusted depending on feedback from a power detector 622, 818, and can thus be used to tune the base frequency of the oscillator 1100. As one of ordinary skill in the art of integrated circuit oscillator circuit design will understand, other types of oscillators in which frequency is tunable based on an input signal can also be used to implement, e.g., embodiments as shown in FIGS. 6 and 8.

Figure 12:
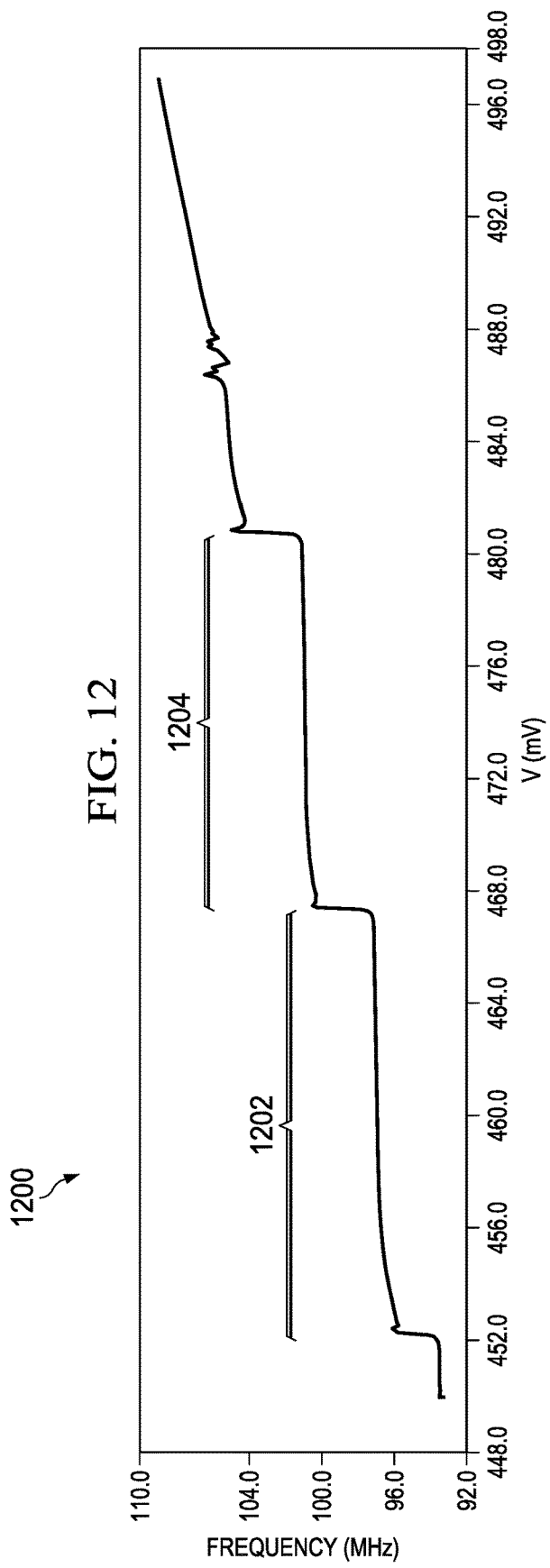
FIG. 12 shows an example of the voltage vs. frequency behavior of a self-injection locking oscillator which injection locks to a difference between two harmonics of an oscillator base frequency.

FIG. 12 shows an example of the voltage vs. frequency behavior 1200 of a self-injection locking oscillator 600, 800 which injection locks to a difference between two harmonics of an oscillator 602 base frequency $\omega_0$. The plot as shown in FIG. 12 was produced using BAW resonators with resonant frequencies of 2.5 GHz and 2.4 GHz and a voltage controlled ring oscillator. At relatively low control voltage 1202 (between about 452.2 mV and 467.2 mV), the base frequency of about 96-97 MHz injection locks to its 25th and 26th harmonics (2400-2425 MHz and 2496-2522 MHz). At higher control voltage 1204 (between about 467.6 mV and 480.6 mV), the oscillator injection locks at a somewhat stabler 100.4-101 MHz to its 24th and 25th harmonics (2409.6-2424 MHz and 2510-2525 MHz). As previously discussed with respect to, e.g., FIG. 6, the oscillator injection locks to a frequency $\hat{\omega}_0 = \omega_0 + \Delta\omega$ that is slightly different from the input signal, i.e., the beat frequency of the two BAW resonators.

Figures 13A, 13B:
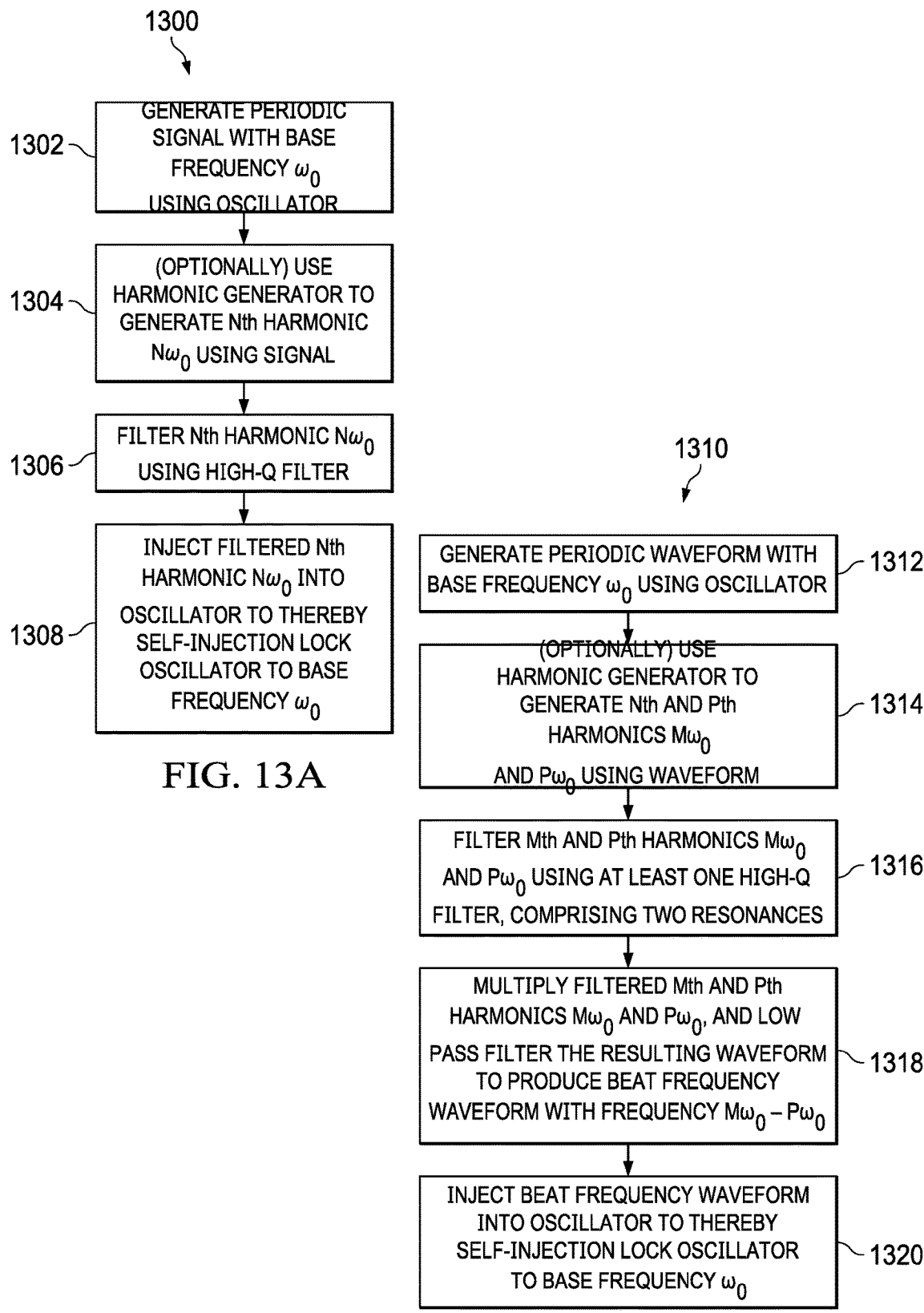
FIG. 13A shows an example of a process, according to preferred embodiments, for self-injection locking an oscillator by injecting into the oscillator a harmonic of a base frequency of the oscillator.
FIG. 13B shows an example of a process, according to preferred embodiments, for self-injection locking an oscillator by injecting into the oscillator a beat frequency waveform comprising the difference between two harmonics of a base frequency of the oscillator.

FIG. 13A shows an example of a process 1300, according to preferred embodiments, for self-injection locking an oscillator by injecting into the oscillator a harmonic of a base frequency of the oscillator. As shown in FIG. 13A, a periodic signal with base frequency $\omega_0$ is generated using an oscillator in step 1302. Optionally, as described with respect to FIGS. 1 and 3, a harmonic generator can be used to generate the Nth harmonic $N\omega_0$ of the base frequency $\omega_0$ using the signal (generated in step 1302) in step 1304. The Nth harmonic $N\omega_0$ is filtered using a high-Q filter to produce a low phase noise, low amplitude noise, group-delayed signal with frequency $N\omega_0$ in step 1306. The filtered signal with frequency $N\omega_0$ is then injected (self-injected) into the oscillator to thereby self-injection lock the oscillator in step 1308.

FIG. 13B shows an example of a process 1310, according to preferred embodiments, for self-injection locking an oscillator by injecting into the oscillator a beat frequency waveform comprising the difference between two harmonics of a base frequency of the oscillator. As shown in FIG. 13B, a periodic signal with base frequency $\omega_0$ is generated using an oscillator in step 1312. Optionally, as described with respect to FIGS. 6 and 8 (see also FIGS. 1 and 3), a harmonic generator can be used to generate the Mth harmonic $M\omega_0$ and the Pth harmonic $P\omega_0$ using the signal (generated in step 1312) in step 1314. The Mth and Pth harmonics are filtered using at least one high-Q filter, comprising two resonances (e.g., one filter with two resonances, or two filters with one filter each) in step 1316. The Mth and Pth harmonics $M\omega_0$ and $P\omega_0$ are multiplied together, and the multiplied signal is low pass filtered to produce a beat frequency waveform of the two harmonics, with frequency $M\omega_0 - P\omega_0$, in step 1318. The beat frequency waveform is injected into the oscillator to thereby self-injection lock the oscillator to base frequency $\omega_0$ in step 1320.

The disclosed innovations (including in Section I and Section II above), in various embodiments, provide one or more of at least the following advantages. However, not all of these advantages result from every one of the innovations disclosed, and this list of advantages does not limit the variously claimed inventive scope.

Enables low-power, low-phase noise clock;
enables clock resilient against absolute drift;
enables elimination of temperature drift in clock output frequency;
enables compact implementation that can be incorporated into an integrated circuit package and/or be fabricated on-chip;

incorporates high frequency high-Q filter(s) without requiring high base frequency (e.g., significantly more than 1 GHz) oscillation to be maintained;

does not require a divider, but can improve phase noise proportional to a ratio N between oscillator's base frequency $\omega_0$, and a selected harmonic $N\omega_0$ of the base frequency;

enables fast start-up and stabilization of low-power, low-phase noise clock;

decouples unity loop-gain from phase noise performance;

enables use of high frequency, high-Q, compact MEMS resonators as filters; and enables clock circuit power consumption to be balanced against clock signal phase noise without affecting oscillator amplitude or frequency.

As disclosed herein, the inventors have discovered methods and systems for producing a low-power, low-phase noise periodic oscillating signal using a self-injection locking oscillator. For example, an oscillator can be configured to receive an injected signal and connected in looped series with a harmonic generator (optionally), two closely matched high-Q bandpass filters, a multiplier, and a low pass filter. The high-Q filters, preferably comprising compact MEMS resonators, pass Mth and Pth harmonics of the base frequency of the oscillator with a group delay. These signals are multiplied together and then fed into a low pass filter to produce a signal corresponding to the beat frequency of—i.e., the difference between—the Mth and Pth harmonics. The group-delayed beat frequency waveform is self-injected into the oscillator—that is, the oscillator's modified output is injected back into the oscillator. The oscillator (the base frequency or a harmonic) locks to the injected beat frequency. The oscillator's base frequency consequently injection locks to itself, with a slight change resulting from the group delay. This significantly reduces phase noise in the injection locked oscillator output signal (e.g., −32 dB). Also, because the closely matched high-Q filters respond identically to absolute drifts and the oscillator injection locks to the difference between filter output frequencies, absolute drifts are subtracted out. Further, the high-Q filters can be designed and fabricated to compensate for each other's temperature drifts. As a result, the injection locked oscillator's output is not only low phase noise, it is also highly resilient against various types of time- and condition-dependent drift.

MODIFICATIONS AND VARIATIONS

As will be understood by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some embodiments, a base frequency of an oscillator is less than 200 MHz or greater than 1 GHz.

In some embodiments, a base frequency of an oscillator can be changed based on input from outside the oscillator circuit and/or outside a device comprising the oscillator circuit. In some embodiments, a base frequency of an oscillator can be changed based on input from within a device comprising the oscillator circuit.

In some embodiments, different filters configured to pass different harmonics of an oscillator's base frequency are available to an oscillator circuit, and which of said filters is used to provide a filtered, group-delayed Nth harmonic (or Mth and Pth harmonics) depends on input from outside the oscillator circuit.

In some embodiments, multi-stage oscillators other than ring oscillators can be used. In some embodiments, single-stage oscillators can be used.

In some embodiments, a ring oscillator with an even number of stages can be used, e.g., a fully-differential ring oscillator.

In some embodiments, output frequency $\omega_0$ is selectable, e.g., by selecting which harmonic of the oscillator will be locked. In some embodiments, selecting which harmonic of the oscillator will be locked comprises selecting from multiple different oscillator circuits (e.g., multiple different ring oscillator circuits with different numbers of stages) that are available (e.g., available on-die). In some embodiments, the harmonic to be locked to can be selected by a user. In some embodiments, selecting the harmonic to be locked to determines the final base frequency $\omega_0$.

In some embodiments, a (preferably compact) high-Q filter can be fabricated using a MEMS resonator or an LC tank circuit, either of which generally enables monolithic integration with CMOS circuits in design and manufacture; or using molecular resonance (though an LC tank circuit will generally be significantly larger than a comparable ring oscillator). Those of ordinary skill in the art of integrated circuit oscillator circuit design will understand that various other high-Q resonance structures and materials can be used to provide a high-Q filter as disclosed herein. For example, an on-chip LC tank can have a Q factor of, e.g., 20 to 30; chip bond wires can have a Q factor of about 50; a quartz crystal can have a Q factor in the millions; and an atomic clock resonance may have a Q factor in the trillions.

In some embodiments, a clock circuit as disclosed with respect to FIGS. 1 and 3 can be used in minimal power mode (relatively higher phase noise) to perform digital data processing, and in higher (but still relatively low) power mode (relatively lower phase noise) to perform RF transmission. In some embodiments, the amount of power supplied to an oscillator circuit as disclosed with respect to FIGS. 1 and 3 is selected in dependence on an application-dependent tolerated level of phase noise.

In some embodiments, multiple resonators with approximately the same center frequency can be used to filter a single frequency.

In some embodiments, resonators other than BAW resonators (e.g., other types of MEMS resonators) can be configured to cancel out thermal drifts in a beat frequency of said resonators.

As will be understood by those of ordinary skill in the art of art of integrated circuit oscillator circuit design, disclosure herein regarding temperature-response matching of BAW resonators can be applied to other resonators in which frequency response to temperature can be controlled by modifying resonator structure.

In some embodiments as shown in FIGS. 6 and 8, high-Q resonators can be used which are not closely matched.

In some embodiments as shown in FIGS. 6 and 8, high-Q filters or high-Q resonators can be used which are not fabricated close to each other.

According to some but not necessarily all embodiments, there is provided: A method of producing a clock signal, comprising the actions of: a) producing, using an oscillator, a signal having a base frequency component and an Nth harmonic component, wherein N is a selected integer and N>1; b) filtering said signal through a bandpass filter with Q factor ≥5, said filter configured to pass said Nth harmonic component as a filtered Nth harmonic component; and c) injecting said filtered Nth harmonic component into said oscillator to thereby injection lock said Nth harmonic component of said signal to said filtered Nth harmonic component, whereby said base frequency of said signal is self-injection locked.

According to some but not necessarily all embodiments, there is provided: A self-injection locking clock circuit, comprising: a) an oscillator configured to output a periodic signal with at least a base frequency and configured to injection lock to an injected signal; and b) a bandpass filter with Q factor ≥5, said filter configured to pass an Nth harmonic of said base frequency to output a passed Nth harmonic, N being an integer selected in at least partial dependence on said base frequency and N>1, said filter operatively coupled to said oscillator to filter said periodic signal and such that said passed Nth harmonic is injected into said oscillator.

According to some but not necessarily all embodiments, there is provided: A method of producing a clock signal, comprising the actions of: a) producing, using an oscillator, a signal having a base frequency component, an Mth harmonic component and a Pth harmonic component, wherein M and P are selected integers and M>P>1; b) filtering said signal through one or more bandpass filters comprising at least two resonators, said filters having Q factor ≥5, said filters configured to pass said Mth and Pth harmonic components as filtered Mth and Pth harmonic components, respectively; c) multiplying said filtered Mth and Pth harmonic components together to produce a multiplied signal, and filtering said multiplied signal using a low pass filter to pass a difference between said filtered Mth and Pth harmonic components, said difference comprising a filtered beat frequency waveform; and c) injecting said filtered beat frequency waveform into said oscillator to thereby injection lock said signal to said filtered beat frequency waveform, whereby said base frequency of said signal is self-injection locked.

According to some but not necessarily all embodiments, there is provided: A self-injection locking clock circuit, comprising: a) an oscillator configured to output a periodic signal with at least a base frequency and configured to injection lock to an injected signal; b) one or more bandpass filters with Q factor ≥5, said filters configured to pass an Mth harmonic and a Pth harmonic of said base frequency to output a filtered Mth harmonic and a filtered Pth harmonic, M and P being integers selected in at least partial dependence on said base frequency and M>P>1, said filters operatively coupled to said oscillator to filter said oscillator output; c) a multiplier configured to multiply said filtered Mth harmonic by said filtered Pth harmonic to produce a multiplied Mth*Pth harmonic waveform having a beat frequency component comprising a difference between said filtered Mth harmonic and said filtered Pth harmonic; and d) a low pass filter configured to pass said beat frequency component as a filtered beat frequency component, such that said filtered beat frequency component is injected into said oscillator.

According to some but not necessarily all embodiments, there is provided: As disclosed herein, the inventors have discovered methods and systems for producing a low-power, low-phase noise periodic oscillating signal using a self-injection locking oscillator. For example, an N-stage oscillator can be configured to receive an injected signal into each of the oscillator's N stages and connected in looped series with, optionally, a harmonic generator, and a high-Q filter. The high-Q filter, preferably comprising a compact MEMS resonator, passes an Nth harmonic of the base frequency of the oscillator with a group delay. The group-delayed Nth harmonic of the oscillator's base frequency is self-injected into the oscillator—that is, the oscillator's modified output is injected back into the oscillator. The oscillator output is injection locked by the injected Nth harmonic to the oscillator's base frequency. The oscillator's base frequency consequently injection locks to itself, with a slight change resulting from the group delay. This significantly reduces phase noise in the injection locked oscillator output signal (e.g., −30 dB).

According to some but not necessarily all embodiments, there is provided: As disclosed herein, the inventors have discovered methods and systems for producing a low-power, low-phase noise periodic oscillating signal using a self-injection locking oscillator. For example, an oscillator can be configured to receive an injected signal and connected in looped series with a harmonic generator (optionally), two closely matched high-Q bandpass filters, a multiplier, and a low pass filter. The high-Q filters, preferably comprising compact MEMS resonators, pass Mth and Pth harmonics of the base frequency of the oscillator with a group delay. These signals are multiplied together and then fed into a low pass filter to produce a signal corresponding to the beat frequency of—i.e., the difference between—the Mth and Pth harmonics. The group-delayed beat frequency waveform is self-injected into the oscillator—that is, the oscillator's modified output is injected back into the oscillator. The oscillator (the base frequency or a harmonic) locks to the injected beat frequency. The oscillator's base frequency consequently injection locks to itself, with a slight change resulting from the group delay. This significantly reduces phase noise in the injection locked oscillator output signal (e.g., −32 dB). Also, because the closely matched high-Q filters respond identically to absolute drifts and the oscillator injection locks to the difference between filter output frequencies, absolute drifts are subtracted out. Further, the high-Q filters can be designed and fabricated to compensate for each other's temperature drifts. As a result, the injection locked oscillator's output is not only low phase noise, it is also highly resilient against various types of time- and condition-dependent drift.

Additional general background, which helps to show variations and implementations, may be found in the following publications (including all of the references set forth hereinabove, which are repeated here), all of which are hereby incorporated by reference: L. Zhang, A. Daryoush, A. Poddar and U. Rohde, "Oscillator phase noise reduction using self-injection locked and phase locked loop (SIL-PLL)," 2014 *IEEE International Frequency Control Symposium (FCS)*, Taipei, 2014, pp. 1-4; Heng-Chia Chang, "Stability analysis of self-injection-locked oscillators," *IEEE Transactions on Microwave Theory and Techniques*, vol. 51, no. 9, pp. 1989-1993, September 2003; Heng-Chia Chang, "Phase noise in self-injection-locked oscillators—theory and experiment," *IEEE Transactions on Microwave Theory and Techniques*, vol. 51, no. 9, pp. 1994-1999, September 2003; X. Yi, C. C. Boon, M. A. Do, K. S. Yeo and W. M. Lim, "Design of Ring-Oscillator-Based Injection-Locked Frequency Dividers With Single-Phase Inputs," *IEEE Microwave and Wireless Components Letters*, vol. 21, no. 10, pp. 559-561, October 2011; and R. Nancollas, S. Bhattarai, "A Simulation Study of Injection Locked Clocking with Ring Oscillators," https://people.eecs.berkeley.edu/~suchitb/EE241_MidTermReport, Mar. 21, 2012, accessed Jun. 5, 2017; and B. Mesgarzadeh, Atila Alvandpour, "A Study of Injection Locking in Ring Oscillators," *IEEE Symposium on Circuits and* Systems, May 23-26, 2005.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

As shown and described herein, the inventors have discovered a variety of new and useful approaches to self-injection locking for low-power low-phase noise oscillators.

What is claimed is:

1. A method of producing a clock signal, the method comprising:
   a) producing, using an oscillator, a signal having a base frequency component and an Nth harmonic component, wherein N is an integer, and N>1;
   b) filtering the signal through a bandpass filter, in which the bandpass filter has Q factor ≥5 and passes the Nth harmonic component as a filtered Nth harmonic component; and
   c) injecting the filtered Nth harmonic component into the oscillator to self-injection lock the base frequency of the signal.

2. The method of claim 1, wherein the base frequency is between 200 MHz and 1 GHz.

3. The method of claim 1, wherein N is an odd number ≥3.

4. The method of claim 1, wherein the producing includes using a harmonic generator to generate the signal using an output of the oscillator.

5. The method of claim 1, wherein the oscillator is a ring oscillator including N stages, and the injecting includes injecting the filtered Nth harmonic component into each of the N stages.

6. The method of claim 1, further comprising inducing a group delay in the Nth harmonic component of the signal using the bandpass filter.

7. The method of claim 1, wherein the N, the Q factor, and an amplitude of the Nth harmonic component are sufficient to produce a phase noise reduction in an injection locked output of the oscillator with respect to a free running output of the oscillator.

8. The method of claim 1, further comprising selecting the N, including by selecting which of multiple filters is used to perform the step b).

9. The method of claim 1, further comprising adjusting properties of the oscillator to select the base frequency of the oscillator between different iterations of the steps a) through c).

10. The method of claim 1, wherein the base frequency component of the signal when the oscillator is free running has a different frequency from the base frequency component of the signal when the oscillator is injection locked.

11. A self-injection locking clock circuit, comprising:
    a) an oscillator configured to output a periodic signal with at least a base frequency and configured to injection lock to an injected signal; and
    b) a bandpass filter having Q factor ≥5, the bandpass filter configured to pass an Nth harmonic of the base frequency to output a filtered Nth harmonic, N being an integer at least partially dependent on the base frequency, in which N>1, and the bandpass filter is operatively coupled to the oscillator and configured to filter the periodic signal to inject the filtered Nth harmonic into the oscillator.

12. The circuit of claim 11, wherein the oscillator is a ring oscillator.

13. The circuit of claim 12, wherein the ring oscillator includes N inverters.

14. The circuit of claim 13, wherein N is an odd number.

15. The circuit of claim 11, wherein the bandpass filter includes a MEMS resonator or an LC tank.

16. The circuit of claim 11, wherein the bandpass filter includes a bulk acoustic wave resonator.

17. The circuit of claim 11, wherein the oscillator is an N-stage oscillator.

18. The circuit of claim 11, further comprising a harmonic generator which generates the Nth harmonic using the periodic signal.

19. The circuit of claim 11, wherein the bandpass filter includes multiple filters configured to respectively pass different Nth harmonies of the base frequency, and the circuit further comprises a selector configured to select which of the multiple filters outputs the filtered Nth harmonic.

20. The circuit of claim 11, wherein the oscillator is configured to adjust a base frequency of the oscillator in at least partial dependence on a signal from outside the circuit.

* * * * *